(12) United States Patent
Kamieniecki

(10) Patent No.: US 7,898,280 B2
(45) Date of Patent: Mar. 1, 2011

(54) ELECTRICAL CHARACTERIZATION OF SEMICONDUCTOR MATERIALS

(76) Inventor: Emil Kamieniecki, Bedford, MA (US)

(*) Notice: Subject to any disclaimer, the term of this patent is extended or adjusted under 35 U.S.C. 154(b) by 223 days.

(21) Appl. No.: 12/206,237

(22) Filed: Sep. 8, 2008

(65) Prior Publication Data

US 2010/0060307 A1 Mar. 11, 2010

(51) Int. Cl.
G01R 31/26 (2006.01)
(52) U.S. Cl. .................................................. 324/765
(58) Field of Classification Search .................. None
See application file for complete search history.

(56) References Cited

U.S. PATENT DOCUMENTS

| | | |
|---|---|---|
| 2,859,407 A | 11/1958 | Henisch |
| 3,939,415 A | 2/1976 | Terasawa |
| 4,000,458 A | 12/1976 | Miller et al. |
| 4,286,215 A | 8/1981 | Miller |
| 4,891,584 A | 1/1990 | Kamieniecki et al. |
| 4,949,034 A | 8/1990 | Imura et al. |
| 5,047,713 A | 9/1991 | Kirino et al. |
| 5,406,214 A | 4/1995 | Boda et al. |
| 5,451,886 A | 9/1995 | Ogita et al. |
| 5,477,158 A | 12/1995 | Shafer et al. |
| 5,661,408 A | 8/1997 | Kamieniecki et al. |
| 5,929,652 A | 7/1999 | Ahrenkiel |
| 6,037,797 A | 3/2000 | Lagowski et al. |
| 6,104,206 A * | 8/2000 | Verkuil ........................ 324/765 |
| 6,275,060 B1 | 8/2001 | Ahrenkiel et al. |
| 6,315,574 B1 | 11/2001 | Kamieniecki et al. |
| 6,369,603 B1 | 4/2002 | Johnston et al. |
| 6,538,462 B1 * | 3/2003 | Lagowski et al. ............ 324/765 |
| 6,909,302 B2 | 6/2005 | Kamieniecki et al. |
| 6,911,350 B2 | 6/2005 | Tsidilkovski et al. |
| 6,967,490 B1 | 11/2005 | Kamieniecki et al. |
| 7,019,513 B1 * | 3/2006 | Faifer et al. ............... 324/158.1 |
| 7,084,661 B2 * | 8/2006 | Thompson et al. .......... 324/766 |
| 7,439,757 B2 * | 10/2008 | Kang et al. ................. 324/770 |
| 7,504,838 B1 * | 3/2009 | Zhao et al. .................. 324/750 |
| 7,656,172 B2 * | 2/2010 | Andrews et al. ............ 324/754 |
| 7,663,385 B2 * | 2/2010 | Kamieniecki ............... 324/752 |
| 2007/0273400 A1 * | 11/2007 | Kamieniecki ............... 324/765 |

OTHER PUBLICATIONS

Adria Nieswand, "Thin is in", R&D Magazine, Dec. 2006.
Industry Strategy Symposium (ISS 2008), SEMI. half Moon Bay, CA [Alexander E. Braun, Semiconductor International, Jan. 29, 2008].

(Continued)

Primary Examiner—Jermele M Hollington
(74) Attorney, Agent, or Firm—Kriegsman & Kriegsman

(57) ABSTRACT

A system and method for characterizing electronic properties of a semiconductor sample includes illuminating the surface of the semiconductor sample with a pulse of light, measuring a photoconductance decay in the semiconductor sample after the cessation of the first pulse of light, and analyzing the photoconductance decay. The electronic properties include properties associated with at least one of the bulk of the semiconductor sample and the surface of the semiconductor sample. The pulse of light has a predetermined duration and photon energy higher than energy gap of the semiconductor. The analyzing step determines a first component of the photoconductance decay substantially associated with point imperfections in the semiconductor sample and at least one second component of the photoconductance decay substantially associated with extended imperfections in the semiconductor sample.

12 Claims, 18 Drawing Sheets

OTHER PUBLICATIONS

D.T. Stevenson, and R.J. Keyes, "Measurement of Carrier Lifetimes in Germanium and Silicon," *J. Appl. Phys.* 26, pp. 190-195 (1955).

H.K. Henish and J. Zucker, "Contactless Method for the Estimation of Resistivity and Lifetime of Semiconductors", Rev. Sci. Instrum. 27, pp. 409-410 (Jun. 1956).

J.C. Brice and P. Moore, Contactless Resistivity Meter for Semiconductors, J. Sci. Instrum. 38, p. 307 (Jul. 1961).

P.J. Olshefski, "Contactless Method for Measuring Resistivity of Silicon," Semic. Prod. 4, pp. 34-36 (Dec 1961).

T. Figielski, "Theory of Carrier Recombination at Dislocations in Germanium", phys. stat. sol. 6, pp. 429-440 (1964) and "Dislocations as Traps for Holes in Germanium", phys. stat. sol. 9, pp. 555-566 (1965).

G.L. Miller, D.A.H. Robinson, and J.D. Wiley, "Contactless measurement of semiconductor conductivity by radio frequency free carrier power absorption", Rev. Sci. Instrum. vol. 47(7), 1976, pp. 799-805.

E. Yablonowitch, and T.J. Gmitter, "A Contactless Minority Carrier Lifetime Probe of Heterostructures, Surfaces, Interfaces, and Bulk Wafers", Solid-State Electron. 35, Mar. 1987, pp. 261-267.

S.M. Sze, "Physics of Semiconductor Devices", John Wiley & Sons, Inc., New York 1981, Chapter 7.

Dieter K. Schroder, "Semiconductor Material and Device Characterization," John Wiley & Sons, Inc., New York 1990, Chapter 7.

H. M'saad, J. Michel, J.J. Lappe, and L.C. Kimerling, "Electronic Passivation of Silicon Surfaces by Halogens", J. Electron. Mat. 23, May 1994, pp. 487-491.

Sinton, R.A. and Cuevas, A., "Contactless determination of current-voltage characteristics and minority-carrier lifetimes in semiconductors from quasi-steady-state photoconductance data", Appl. Phys. Lett. vol. 69(17), 1996, pp. 2510-2512.

* cited by examiner

ELECTRICAL CHARACTERIZATION OF SEMICONDUCTOR MATERIALS

FIELD OF THE INVENTION

This invention relates to electrical characterization of semiconductor materials.

BACKGROUND

The defining metric of what is competitive in the photovoltaics industry is the cost per kilowatt-hour. The success of a specific photovoltaic technology depends on its ability to reduce the manufacturing cost and increase the efficiency of the solar cells. In the integrated circuit (IC) industry, the cost of the substrate is frequently a negligible fraction of the total manufacturing cost. On the other hand, in the photovoltaics industry, the cost of the substrate material may ultimately determine the viability of the produce. The cost and the quality of substrates used for photovoltaic solar cells is critical in the manufacture of the cells.

More than 90% of photovoltaic solar cell manufacturers use silicon as a substrate material, and silicon wafers can account for as much as 45% of the total cost of photovoltaic modules. Hence, reducing the manufacturing cost of substrate materials without sacrificing quality is a potential opportunity for decreasing the cost of photovoltaics. Such an improvement, which is critical for both silicon and thin-film photovoltaics, should be achieved without a substantial reduction of the conversion efficiency of the photovoltaic cells.

Photovoltaic cells can be manufactured using electronic-grade silicon wafers; however, an increasingly common approach to reducing the cost of the photovoltaic substrate material is the use of lower quality (i.e., more impure) silicon sources and the replacement of single crystal silicon with multicrystalline silicon. Multicrystalline silicon can be fabricated by casting ingots and slicing the ingots into wafers. A growing number of manufacturers further reduce the cost of the substrate material by replacing sliced wafers with sheet or ribbon technology, which creates monocrystalline or multicrystalline silicon directly from a silicon melt. One such technology is the "String Ribbon Crystal Growth Technology" used by Evergreen Solar, Inc. Multicrystalline silicon suffers from a higher level of contamination due to the use of a less pure silicon source and also from a higher density of crystalline defects than single crystal (electronic-grade) silicon. Multicrystalline substrates are less expensive to manufacture, but photovoltaic cells made of multicrystalline silicon are also less efficient than cells made from single crystal silicon.

Transition metals are often a main culprit in degrading the efficiency of multicrystalline silicon solar cells. Multicrystalline photovoltaics also suffer from a large density of crystalline defects such as grain boundaries, as illustrated in FIG. 1. The density of grain boundaries, which is related to the size of crystallites in the sample, is one of the major parameters for differentiation between various silicon growth technologies.

The use of thin films of photovoltaic material deposited directly onto rigid or flexible substrates offers additional cost savings. Thin film cells use around one-one hundredth the amount of semiconductor material used in single crystal or multicrystalline cells. Furthermore, in addition to silicon, the deposited photovoltaic material can be other inorganic semiconductors or even organic materials with optical properties better suited to the solar spectrum. In silicon, for instance, the theoretical upper limit of efficiency (i.e., the conversion of light to electricity) under normal full-sun illumination is 31%. This limit is largely a result of the 1.1 eV band gap of silicon, which corresponds to a photon wavelength of 1127 nm. In practice, systems using crystalline silicon as a photovoltaic material are only about 20-25% efficient. In contrast, a more efficient photovoltaic cell is a three-junction indium gallium phosphide/indium gallium arsenide/ germanium cell, which increases the conversion efficiency to 37%. Fundamentally different devices, however, could have a theoretical efficiency as high as 87%. However, because non-silicon photovoltaic material is often based on compound semiconductors (e.g., copper indium gallium diselenide, or CIGS), the concentration of defects in such thin films can be even higher than the concentration in silicon.

Improving manufacturing processes and increasing manufacturing yields in photovoltaic fabrication requires reliable information regarding critical electrical properties of the substrate materials. One of the most critical parameters, the minority carrier lifetime $\tau$, defines the quality of the photovoltaic substrate material and the efficient of the solar cells. The minority carrier lifetime, a measure of how long carriers (i.e., electrons and holes) remain before recombining, is highly sensitive to the presence of defects detrimental to device performance. A related parameter, the minority carrier diffusion length, is the average distance a carrier moves from its point of generation before it recombines. The longer the lifetime, the longer the diffusion length, and the higher the probability that optically generated carriers will reach the collection point (i.e., the p-n junction) and produce current in an external circuit. A shorter lifetime translates to a lower conversion efficiency of the solar cell and a poorer economic viability of the product.

The dominant approaches to measurement of the carrier lifetime in the photovoltaic industry are photoconductive decay (PCD) methods. In this technique, electron-hole pairs are created by an optical excitation that changes the conductivity of the sample. The recombination of excess carriers is monitored by measuring the decay of the conductivity after the illumination is turned off. Optical excitation with a pulse having a photon energy that exceeds the energy gap of the semiconductor generates excess electron-hole pairs, increasing the conductivity of the semiconductor (i.e., photoconductance). Relaxation of this photoconductance to the initial equilibrium state is detected using either radio frequency techniques (RF-PCD) or microwave reflectance techniques ($\mu$-PCD). Both RF-PCD and $\mu$-PCD measure an 'effective total lifetime.' In this approach, separation of the bulk lifetime from the surface recombination requires surface passivation, such as immersion of silicon in HF, iodine passivation, or corona charging. Alternatively, the requirement for surface passivation can be reduced by measuring slabs of material at least ten times thicker than standard photovoltaic substrates and using deeply penetrating illumination (i.e., longer wavelength). In $\mu$-PCD, a microwave beam is directed to the sample and the reflected microwave power, which is proportional to the conductance of the sample, is measured. $\mu$-PCD systems, unlike RF-PCD systems, exhibit a non-linear dependence on the injection level, and thus meaningful $\mu$-PCD measurements are limited to a narrow range of excess carrier concentrations.

Another approach to measuring the minority carrier lifetime is the surface photovoltage (SPV) method. SPV measures the minority carrier diffusion length, which is directly related to the minority carrier lifetime and which can be used interchangeably with the lifetime in material characterization. An advantage of SPV over PCD is the ability of SPV to distinguish between bulk and surface carrier recombination. However, SPV requires a sample thickness larger than the carrier diffusion length which, for typical materials used in commercial solar cells (carrier lifetime ~2-5 µs), exceeds the standard thickness of silicon photovoltaic wafers (around 100-200 µm). Additionally, in the SPV method, uncontrolled surface recombination at the wafer backside may strongly interfere with carrier recombination in the bulk, leading to misleading data. Furthermore, extended imperfections such as grain boundaries and dislocations can also interfere with SPV measurements, reducing their reliability.

Differentiation between recombination processes occurring in the bulk of the device and at the interfaces can be accomplished by identifying the dependence of lifetime on the geometry of the device being tested or on the excitation wavelength. Determining the underlying physics of the recombination process can be accomplished by analyzing the dependence of the lifetime on the level of photo-excitation and temperature. Such an approach, while cumbersome and time consuming, is quite effective in the R&D environment; however, it is not suitable for in-line monitoring of the manufacturing process.

The quasi-steady-state photoconductance (QSSPC) method measures the dependence of the lifetime (multiplied by the carrier mobility) on the level of photo-excitation from a quasi steady-state value of the photoconductance. In QSSPC, as in the PCD method, separation of the bulk lifetime from surface recombination requires surface passivation unless performed on slabs of material at least ten times thicker than standard photovoltaic substrates.

Separation of the effects of surface or extended crystallographic imperfections from the effect of bulk contaminants and bulk point defects is critical for process optimization and control of the fabrication of photovoltaics. The ability to maintain a low concentration of electrically active metallic impurities and crystalline defects is essential for achieving a high yield in silicon manufacturing and thus for reducing the cost of photovoltaic devices.

SUMMARY

This invention relates generally to a method and a system for characterizing electronic properties of a semiconductor sample.

In one aspect, a method for characterizing electronic properties of a semiconductor sample includes illuminating the surface of the semiconductor sample with a pulse of light, measuring a photoconductance decay in the semiconductor sample after the cessation of the first pulse of light, and analyzing the photoconductance decay. The electronic properties include properties associated with at least one of the bulk of the semiconductor sample and the surface of the semiconductor sample. The pulse of light has a predetermined duration and a photon energy higher than an energy gap of the semiconductor. The analyzing step determines a first component of the photoconductance decay substantially associated with point imperfections in the semiconductor sample and at least one second component of the photoconductance decay substantially associated with extended imperfections in the semiconductor sample.

In embodiments of this aspect of the invention, illuminating the surface of the semiconductor sample and measuring the photoconductance decay is performed at a constant distance from the semiconductor sample.

If the bulk of the semiconductor sample includes only point imperfections and the only extended imperfection is the surface of the semiconductor sample embodiments may include one or more of the following. The electronic properties of the bulk of the semiconductor sample are determined by analyzing the first component of the photoconductance decay and the electronic properties of the surface are determined by analyzing the second component of the photoconductance decay.

If the bulk of the semiconductor sample includes at least one of point imperfections and extended imperfections and the surface of the semiconductor sample is passivated, electronic properties of the bulk of the semiconductor sample associated with point imperfections are determined by analyzing the first component of the photoconductance decay and electronic properties of the bulk of the semiconductor sample associated with extended imperfections are determined by analyzing the second component of the photoconductance decay. The method includes determining a ratio of a first volume of the semiconductor sample in which point imperfections dominate carrier recombination to a second volume of the semiconductor sample in which extended imperfections dominate carrier recombination.

If the electronic properties of the bulk of the semiconductor sample include electronic properties associated with point imperfections and electronic properties associated with extended imperfections in the bulk and the surface of the semiconductor sample is substantially not passivated, the electronic properties associated with point imperfections are determined by analyzing the first component of the photoconductance decay. The electronic properties associated with extended imperfections in the bulk and the electronic properties of the surface of the semiconductor sample are determined by analyzing the second component of the photoconductance decay.

Illuminating the surface of the semiconductor sample includes illuminating the surface of the semiconductor sample with a first pulse of light having a first wavelength and a first intensity. Measuring a photoconductance decay includes measuring a first photoconductance decay. Analyzing the photoconductance decay includes analyzing the first photoconductance decay. The method includes illuminating the surface of the semiconductor sample with a second pulse of light having a second wavelength and a second intensity, measuring a second photoconductance decay in the semiconductor sample after the cessation of the second pulse of light, analyzing the second photoconductance decay to determine a third component of the photoconductance decay substantially associated with extended imperfections in the semiconductor sample, and distinguishing between the electronic properties associated with extended imperfections in the bulk and electronic properties of the surface of the semiconductor sample on the basis of the second component of the photoconductance decay and the third component of the photoconductance decay. At least one of the second wavelength and the second intensity is different from the first wavelength and the first intensity. The method includes determining a ratio of a first volume of the semiconductor sample in which point imperfections dominate charge carrier recombination to a second volume of the bulk of the semiconductor sample in which extended imperfections dominate carrier recombination. The pulse of light includes at least two wavelengths.

The electronic properties of the surface of the semiconductor sample comprise at least one of a surface charge density, a density of surface traps, and a surface potential barrier. The density of surface traps is used to monitor a surface cleaning or etching processes. The electronic properties of the bulk of the semiconductor sample comprise at least one of a probability per unit time that a majority carrier will be captured by an available point imperfection or extended imperfection, an effective volume of extended imperfections in the bulk of the semiconductor sample, a bulk carrier lifetime, and a subsurface doping concentration. The subsurface doping concentration is determined and used to calibrate an apparatus performing the measurement. The subsurface doping concentration is determined and used to characterize a subsurface region of the semiconductor sample. The subsurface doping concentration is determined and used to characterize a thin film.

The pulse of light has a duration sufficient to achieve steady-state photoconductance in the sample. An interval between consecutive pulses of light is sufficient to allow the sample to substantially reach thermal equilibrium. Measuring the photoconductance decay in the semiconductor sample includes performing the measurement at a distance from the surface of the sample. The distance is between 1 µm and 300 µm, e.g., between 25 µm and 100 µm. The first component of the photoconductance decay is approximated by an exponential function. The second component of the photoconductance decay is approximated by a logarithmic function. The method includes generating inversion conditions at the surface of the semiconductor sample prior to illuminating the surface of the semiconductor sample. The inversion conditions are generated using a chemical treatment or corona charge.

Illuminating the surface of the semiconductor sample can further include varying the intensity of the pulse of light, varying the photon energy, or both.

In another aspect, a method for characterizing electronic properties of a semiconductor sample includes illuminating a surface of the semiconductor sample for a duration of time sufficient to establish steady-state photoconductance in the semiconductor sample, measuring a non-linear dependence of a photoconductance in the semiconductor sample on the intensity of the illumination, and analyzing the non-linear dependence of the photoconductance on the intensity of the illumination to determine electronic properties of the semiconductor sample. In an embodiment, the electronic properties of the sample include at least one of a surface charge density, a density of surface electronic traps, a bulk carrier lifetime, or a subsurface doping concentration. In another embodiment, measuring the photoconductance decay in the semiconductor sample includes performing the measurement at a distance from the surface of the sample.

In a further aspect, a system for characterizing electronic properties of a semiconductor sample includes a light source, an inductive probe, an RF source, and a controller. The light source is positioned to illuminate the semiconductor sample with a pulse of light having a predetermined duration and a photon energy higher than an energy gap of the semiconductor sample. The inductive probe is spaced from the semiconductor sample and positioned to provide an RF signal to the semiconductor sample. The inductive probe is further configured to detect a photoconductance signal from the semiconductor sample in response to the pulse of light. The RF source provides the RF signal having a frequency to the inductive probe. The controller tunes the frequency of the RF signal provided to the inductive probe on the basis of the semiconductor sample In embodiments of this aspect of the invention, the controller can automatically tune the frequency of the RF signal. The system can further include an RF bridge electrically connected between the RF source and inductive probe. The RF bridge has a resonance branch including the inductive probe and a reference branch including a mechanism for varying the magnitude and phase of the reference branch.

The controller can be configured to control the mechanism for varying the magnitude and phase of the reference branch as well as to control the light source.

The inductive probe includes an optical fiber coupled to the light source and a detector coil and can further include an electromagnetic shield surrounding the optical fiber and the detector coil. The inductive probe is spaced from the semiconductor sample at a fixed distance.

The controller can be configured to perform the steps of illuminating the surface of the semiconductor sample with a pulse of light having a predetermined duration and a photon energy higher than an energy gap of the semiconductor; measuring a photoconductance decay in the semiconductor sample after the cessation of the first pulse of light; and analyzing the photoconductance decay to determine a first component of the photoconductance decay substantially associated with point imperfections in the semiconductor sample and at least one second component of the photoconductance decay substantially associated with extended imperfections in the semiconductor sample.

In this embodiment, an RF bridge can be electrically connected between the RF source and inductive probe, the RF bridge having a resonance branch including the inductive probe and a reference branch including a mechanism for varying the magnitude and phase of the reference branch. The RF bridge can be further configured to be balanced before measuring the photoconductance decay in the semiconductor sample.

The use of a method or system for characterizing electronic properties of a semiconductor sample has a number of advantages. In particular, because the effects of various material imperfections are controlled by different process parameters, effective process control requires the ability to monitor the electrical effect of each type of imperfection separately. A non-contact, non-destructive system and method as described above can be used for rapid, in-line monitoring and characterization of the carrier lifetime in semiconductor samples. Bulk and surface effects are separated in a single measurement step without requiring surface passivation. The effect of bulk point imperfections on the carrier recombination can be distinguished from the effect of other critical types of material imperfections such as extended imperfections. Such a metrology system and method enables better process optimization and in-line process control of photovoltaic fabrication, improving yields of functioning devices and reducing the cost of photovoltaic solar cells.

DETAILED DESCRIPTION

Semiconductor Characterization System

Figure 3:
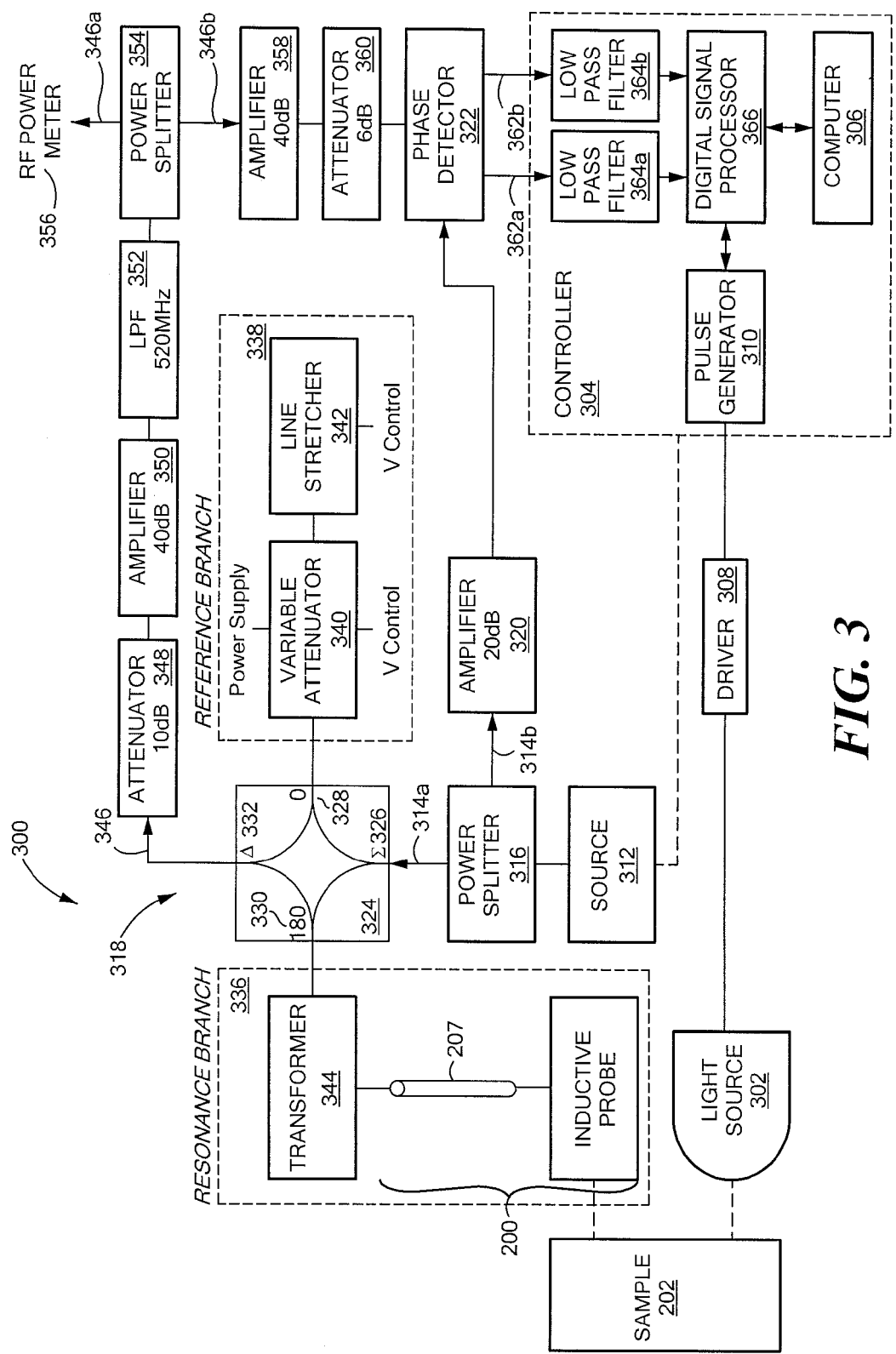
FIG. 3 is a block diagram depiction of a semiconductor characterization system.

A system and a method for measuring the photoconductance of a semiconductor sample are discussed below. Referring for example to FIG. 3, semiconductor sample 202 is illuminated with a pulse of light from a light source 302, which induces photoconductance in the sample. A probe 200 inductively coupled to the sample senses the change in conductivity as a result of the induced photoconductance in the sample. The probe 200 is connected to a controller 304, which processes a signal related to the change in conductivity. The processed signal is then used to determine electronic properties of the semiconductor sample.

Figure 1:
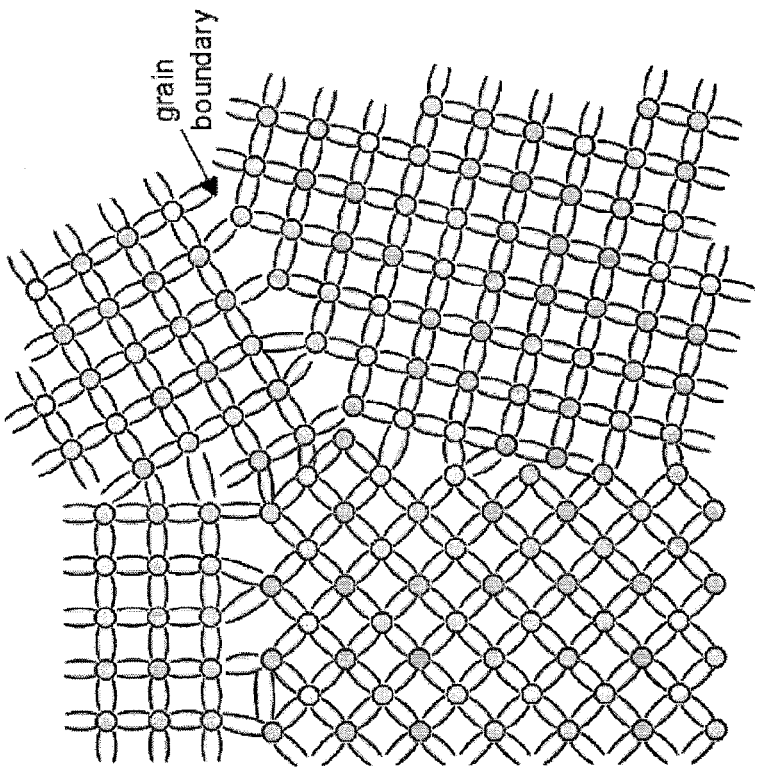
FIG. 1 is a depiction of imperfections in a semiconductor.
Figure 1:
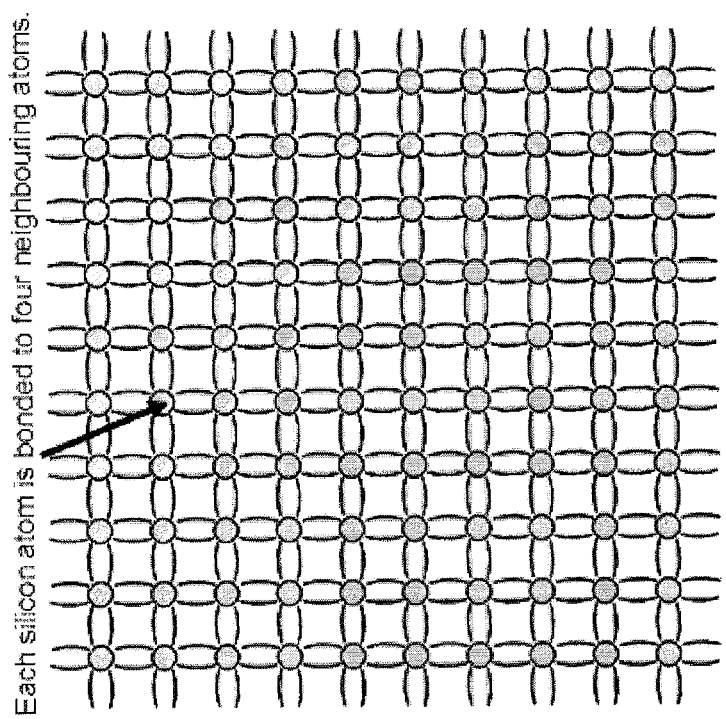
Figure 2:
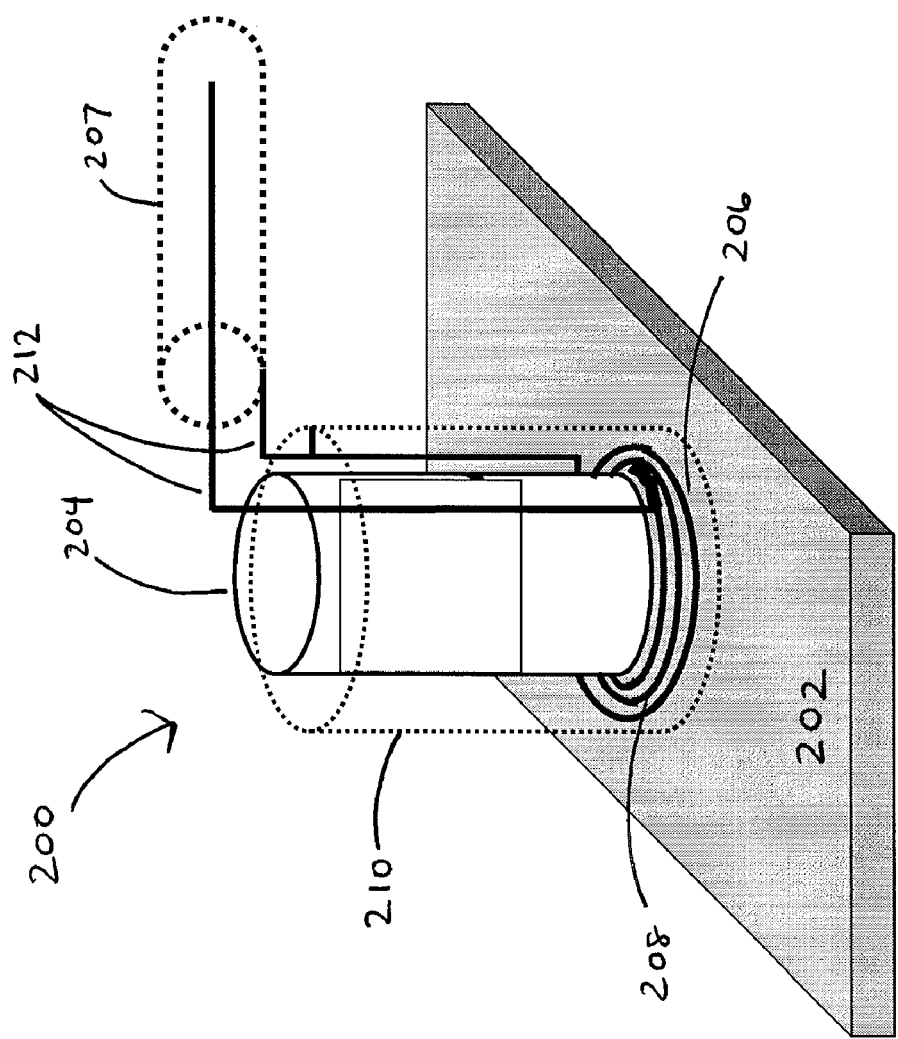
FIG. 2 is a schematic drawing of a probe for measuring the photoconductance of a semiconductor sample.

Referring to FIG. 2, probe 200 for electrical characterization of semiconductor sample 202 works in the radio frequency (RF) range, and more specifically in the ultrahigh frequency (UHF) range. Probe 200 is inductively coupled to sample 202 to form an inductance-capacitance (LC) resonance circuit that is sensitive to the conductivity of semiconductor sample 202. A voltage of the LC-resonance circuit is linearly related to the conductivity of sample 202 over a broad range of conductivity. Measurements of sample 202 are performed at or near the resonance frequency of the LC circuit. Probe 200 also provides for the illumination of sample 202 with an illumination pulse of light. The illumination pulse induces photoconductance in sample 202 by generating minority carriers in the sample. When the illumination pulse ceases, the photoconductance in sample 202 decays. This change is sensed by the LC circuit and can be analyzed to determine electrical properties of sample 202.

Probe 200 contains an optical fiber 204, such as a 1 mm fused silica fiber or an acrylic fiber having an inner diameter of 1 mm, for illuminating sample 202. A detection coil 206 in the form of a surface coil is coplanar with the end of optical fiber 204 closest to semiconductor sample 202. Detection coil 206 is composed of multiple windings 208 (for instance, approximately three windings, or more specifically approximately 2¾ windings). The axis of optical fiber 204 is aligned with the center of windings 208; optical fiber 204 is held in place relative to windings by a fiber optic collar (not shown). Surrounding optical fiber 204 and detection coil 206 is a cylindrical copper shield 210. An end of one of the windings 208 is electrically connected through connections 212 to copper shield 210 and to a shield of a semi-rigid coaxial cable 207. In another embodiment, copper shield 210 is not grounded. Any space between optical fiber 204, windings 208, and copper shield 210 is filled with an insulating epoxy. The bottom of the insulating epoxy is optically polished to achieve a planar surface at the base of probe 200. The base of probe 200 is adjusted using an optical mount to be parallel to the surface of sample 202.

Probe 200 is not in contact with sample 202; instead, a constant separation between sample 202 and the base of probe 200 is automatically maintained by using a conventional electromechanical actuator or stage (not shown) controlled by an optical or capacitive distance-measuring sensor. For instance, the separation is between about 1 µm and 300 µm, or between about 25 µm and 100 µm.

In one embodiment, the detection coil is wound around an optical collimator and the optical fiber is coupled to the collimator. Use of a collimator reduces the dependence of the light intensity of the separation between the sample and the detection coil.

Referring again to FIG. 3, sample 202 is illuminated with light from light source 302, which is coupled to optical fiber 204 (not shown) in probe 200 and which generates light of a desired wavelength and intensity. The illumination light may be pulsed or continuous. The illuminated area of sample 202 is, for instance, 1 mm in diameter. In other embodiments, light from light source 302 is directed toward sample 202 by another type of light guide. Light source 302 is, for instance, a laser diode emitting light at a photon energy greater than the band gap energy of sample 202. The illumination light is thus capable of inducing production of electron-hole pairs in the sample.

Controller 304, which includes one or more computers 306 with programmable processors, controls the output of light source 302 and is coupled to light source 302 via a driver 308. A pulse generator 310 in controller 304 controls the intensity of the light emitted by light source 302 and the duration and repetition frequency of the illumination pulses, which may be rectangular pulses. Controller 304 also generally includes an analog-to-digital convertor (not shown) and a digital signal processor 366.

Sample 202 is also subjected to radio frequency (RF) electromagnetic radiation, preferably ultrahigh frequency (UHF) electromagnetic radiation. A frequency synthesizer 312, such as an oscillator, acts as an RF source and generates an RF signal 314, which passes through a power splitter 316. Frequency synthesizer 312 is controlled by controller 304. Power splitter 316 sends a first portion 314 a of RF signal 314 to an RF bridge 318 and a second portion 314 b through an amplifier 320 to a phase detector 322 (see below). Frequency synthesizer 312 may be, for instance, model PTS500 from Programmed Test Sources, Inc., Littleton, Mass., capable of providing a signal in a frequency range from 1 MHz to 500 MHz. RF bridge 318 is constructed around a 180-degree hybrid 324, which is a passive RF coupling device that includes four ports. An example of a suitable hybrid is model HC-W500-MS available from Universal Microwave Components Corporation (UMCC, Alexandria, Va.). When a signal is applied at a sum port ($\Sigma$ port) 326 of hybrid 324, that signal is equally divided in phase and amplitude and appears at both a 0-degree port 328 and a 180-degree port 330. Any signal reflected from 0-degree port 328 appears in phase at a delta port ($\Delta$ port) 332; any signal reflected from 180-degree port 330 appears 180 degrees out of phase at $\Delta$ port 332.

Signal 314a provided by frequency synthesizer 312 is applied to $\Sigma$ port 326 of hybrid 324. One-half of signal 314a is sent into a resonance branch 336 (see below); any power reflected from resonance branch 336 appears in phase at $\Delta$ port 332. The other half of signal 314 a is sent through 0-degree port 328 to a reference branch 338. Reference branch 338 functions to balance RF bridge 318, as described below in conjunction with FIG. 4. In reference branch 338, the signal passes through a computer controlled variable attenuator 340 and then to a computer controlled line stretcher 342. Reference branch 338 ends in either an open circuit or a short circuit. If reference branch 338 ends in an open circuit, the signal is reflected with no phase shift; the signal returning to hybrid 324 then has a phase shift equal to twice the phase shift of line stretcher 342 and variable attenuator 340. If reference branch 338 ends in a short circuit, the signal is reflected with a phase shift of 180 degrees; the signal returning to hybrid 324 then has a phase shift equal to 180 degrees plus twice the phase shift of line stretcher 342 and variable attenuator 340. By adjusting the phase shift of line stretcher 342 and variable attenuator 340, the signal reflected from resonance branch 336 can thus be cancelled in hybrid 324.

Resonance branch 336 contains probe 200. In one embodiment, coaxial cable 207 of probe 200 is connected to 180-degree port 330 of hybrid 324 through an RF transformer 324, such as two transformers of model TC4-11, manufactured by Mini-Circuits, Brooklyn, N.Y., connected in series. This configuration ensures that the input impedance of hybrid 324, for instance 50 Ohms, is matched. In another embodiment, the diameter of detection coil 206 and the number of windings 208 are selected such that the input impedance of hybrid 324 is closely matched. In this case, coaxial cable 207 is connected directly to 180-degree port 330 of hybrid 324 without the need for a transformer.

The signal returning from resonance branch 336 exits hybrid 324 from Δ port 332 as a signal 346. Signal 346 passes through a first attenuator 348, a first amplifier 350, a low-pass filter 352, and reaches a power splitter 354. Power splitter 354 sends a first portion 346a of signal 346 to an RF power meter 356 and a second portion 346b of signal 346 through a second amplifier 358 and a second attenuator 360 to an RF phase detector 322. RF phase detector 322 demodulates signal 346a into two output DC signals 362a and 362b representing quadrature components of incoming signal 346a. Output signals 362a and 362b enter controller 304 and pass through low-pass filters 364a and 364b, respectively, which remove high frequency components from the signals. Signals 362a and 362b then pass through the analog-to-digital converter (not shown) and are processed by digital signal processor (DSP) 366 and computer 306. This process is performed multiple times, digitized, averaged, and, after subtraction of offsets, the results are combined to determine a magnitude of the signal. Use of the signal magnitude reduces the phase noise of the system and reduces the sensitivity to phase adjustment in reference branch 338 of RF bridge 318.

Figure 4:
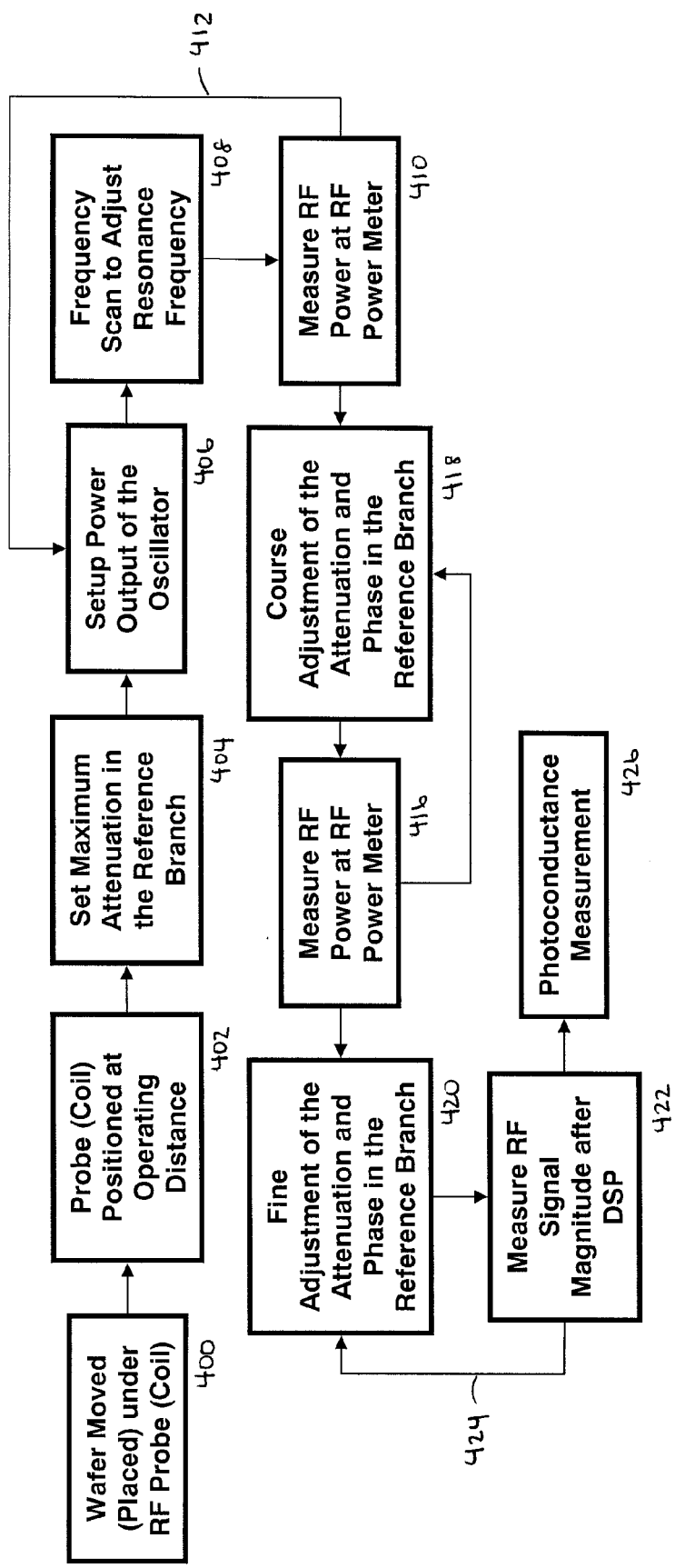
FIG. 4 is a flow diagram illustrating the procedure for initializing the semiconductor characterization system.

Referring to FIG. 4, the process for initializing characterization system 300 is shown. To achieve maximum sensitivity, measurements are performed at or near the resonance frequency of the input LC circuit of probe 200. Adjustments of the operating RF frequency are performed for each sample. Sample 202 is placed under probe 200 (400) and probe 200 is positioned at a desired operating distance from sample 202 (402). Variable attenuator 340 in reference branch 338 is set to maximum attenuation (404). Frequency synthesizer 312 is set to low power output to prevent system overload (406), and the output frequency of frequency synthesizer 312 is scanned to adjust the resonance frequency of the input LC circuit (408). The signal 346 a to RF power meter 356 is measured (410); the resonance frequency is found when the magnitude of signal 346 a to RF power meter 356 is minimized. Steps 406, 408, and 410 are repeated (412), gradually increasing the output RF power of frequency synthesizer 312, until the RF power reaches its nominal power, which is predetermined in each measurement recipe. In one embodiment, the adjustment of the resonance frequency is computer controlled and performed by automatically scanning the output frequency of frequency synthesizer 312.

Figure 5:
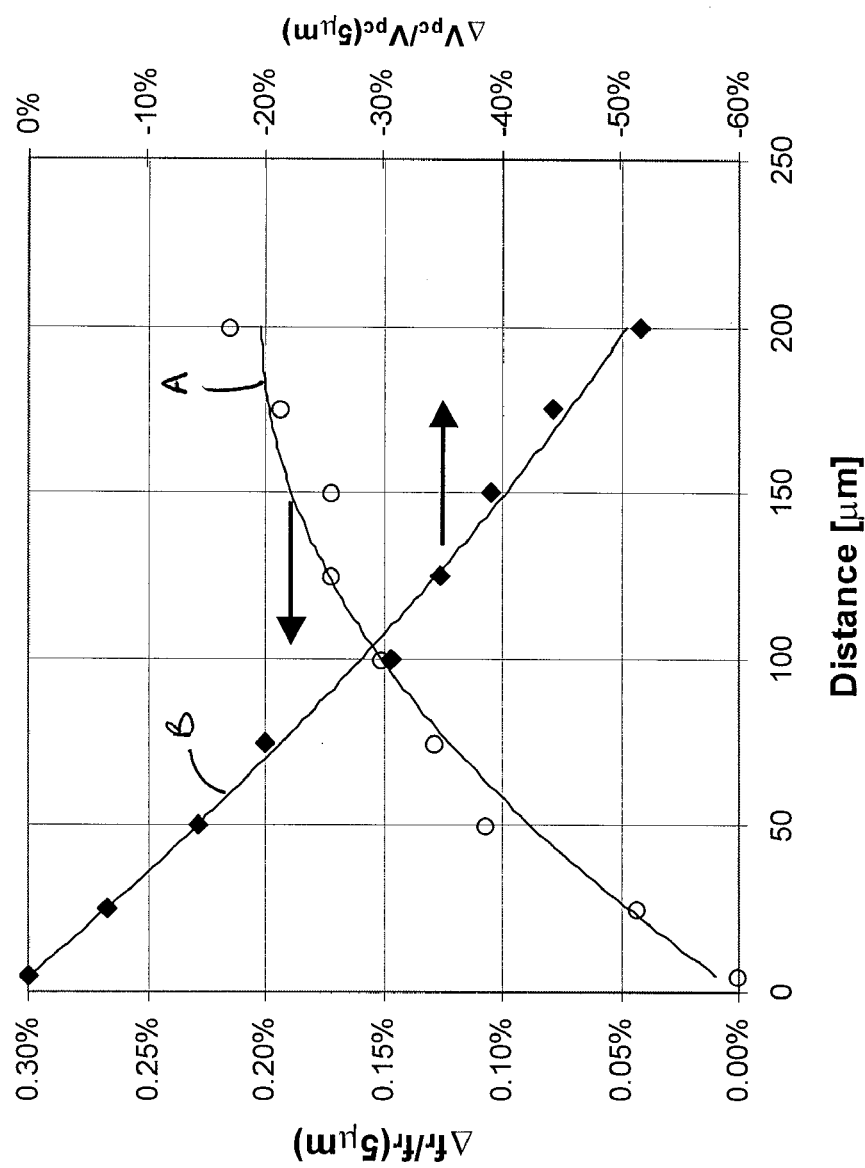
FIG. 5 is a graph showing the dependence of the resonance frequency and the photoconductance on the distance between probe and sample.

Referring to FIG. 5, the resonance frequency of the input LC circuit, shown by curve A, is only weakly dependent on the separation between sample 202 and probe 200. However, the photoconductance, shown by curve B, is much more sensitive to this distance. Thus, setting the operating distance is an important step in the measurement procedure. The change in the resonance frequency, $f_r$, is normalized to the resonance frequency at 5 μm separation (i.e., $\Delta f_r/f_r(5\,\mu m)=(f_r-f_r(5\,\mu m))/f_r(5\,\mu m)$). The change in photoconductance is normalized to the photoconductance at 5 μm separation (i.e., $\Delta V_{pc}/V_p(5\,\mu m)=(V_{pc}-V_p(5\,\mu m))/V_p(5\,\mu m)$).

Referring again to FIG. 4, once the resonance frequency is adjusted, RF bridge 318 is balanced, starting from a minimized signal to RF power meter 356, which provides a coarse null. The phase and magnitude of the signal are coarsely adjusted (414) by line stretcher 342 and variable attenuator 340, respectively, in reference branch 338 and the signal 346a at RF power meter 356 is measured (416) by DSP 366 and computer 306. The coarse adjustments are repeated (418) until a coarse minimum of signal 346a is achieved. Fine adjustments to the phase and attenuation are then performed (420) and the magnitude of the signal after DSP 366 is measured (422). The fine adjustments are repeated (424) until a fine minimum of the signal is achieved. In one embodiment, the coarse and fine minima of signal are defined as values within predefined multiples of the standard deviation of the noise limits of RF power meter 356 and DSP 366, respectively. This process allows the signal to be cancelled accurately, increasing sensitivity to small variations in the signal. In one embodiment, the adjustment of the magnitude and phase of reference branch 338 is computer controlled and performed automatically.

After RF bridge 318 is balanced, a photoconductance measurement is performed on sample 202 (426). A change in photoconductance in sample 202 affects the impedance between sample 202 and probe 200 and results in a loss of balance of RF bridge 318 and a corresponding change in signal 346 exiting Δ port 332. The resulting RF signal is submitted to RF phase detector 322, where it is split into output signals 362a and 362b. These output signals are filtered in controller 304 by low-pass filters 364a and 364b. The signal is repetitively measured a predetermined number of times. Each time, the signal is digitized for processing in DSP 366 and subject to averaging, subtraction of offsets, and analysis in computer 306.

Figure 6:
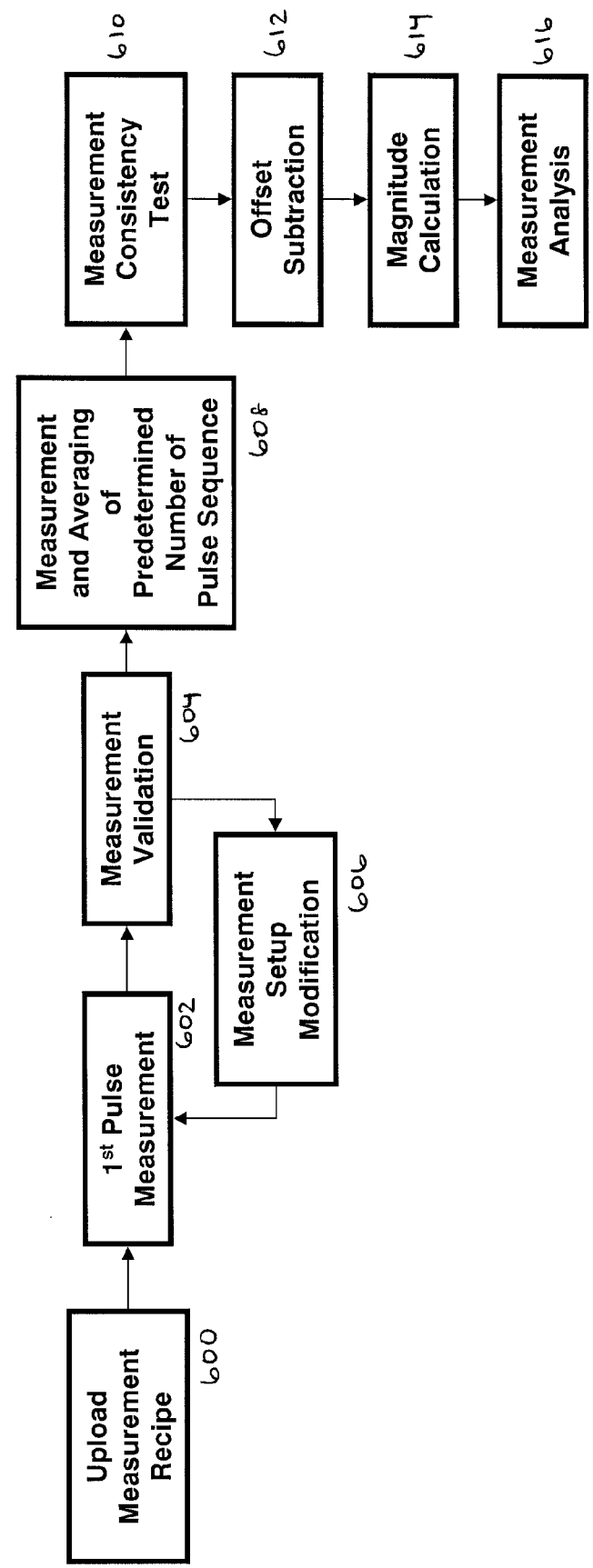
FIG. 6 is a flow diagram illustrating the procedure for performing a photoconductance measurement using the semiconductor characterization system

Referring to FIG. 6, the procedure for performing a photoconductance measurement is shown. Measurement is controlled by computer 306 in controller 304. A measurement recipe is uploaded into controller 304 (600); this is done either after RF bridge balancing or at the initiation of the measurement. The measurement recipe includes parameters such as the desired operating distance between sample 202 and the base of probe 200, a measurement pulse sequence, and the number of pulse sequences over which to average the measurement.

Figure 7:
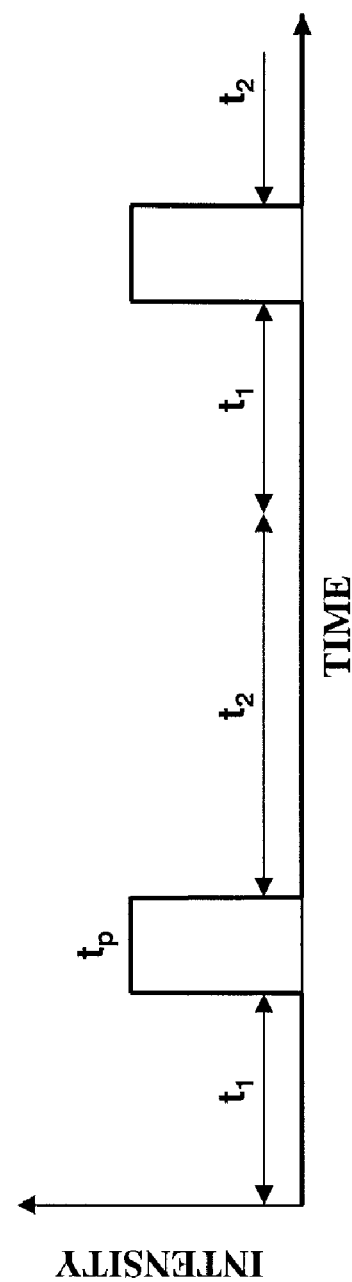
FIG. 7 is an example of a measurement pulse sequence.

Referring to FIG. 7, an example of a measurement pulse sequence having a rectangular pulse is shown. A time period $t_1$ occurs prior to pulse initiation. The pulse itself has a width $t_p$. After the conclusion of the pulse, a time period $t_2$ occurs prior to initiation of the subsequent pulse sequence. In other embodiments, the pulse sequence includes continuous illumination to measure steady-state photoconductance.

Referring again to FIG. 6, the sample is illuminated with a first pulse sequence (602) and the measurement parameters are validated (604). To validate the measurement parameters, the signal during time period $t_1$ is compared with the signal at the end of time period $t_2$. In one embodiment, $t_2$ is equal to $t_1$, and the measurement is validated if both signals are statistically the same (i.e., the difference between signals is less than a predetermined number of standard deviations of noise, as dictated by the measurement recipe). Validation ensures that a sufficient interval exists between illumination pulses to allow sample 202 to return to thermal equilibrium (dark) conditions prior to beginning the next pulse sequence. Not complying with the validation conditions may result in an apparent exponential decay of the photoconductance and thus in an incorrect determination of carrier lifetime. A second criterion for measurement validation involves determining that steady-state photoconductance is achieved during the illumination pulse. This is verified by checking that during a test period toward the end of the pulse, the signal is constant within a predetermined number of standard deviations of noise. Validation is performed for each component of the signal reaching phase detector 322. If the validation is unacceptable, the pulse length (if steady-state photoconductance during the pulse is required) and/or the pulse frequency are modified (606) and the validation is repeated until correct. Validation may be performed either automatically or under user control, depending on the setup of the measurement recipe.

After validation of the measurement parameters, characterization system 300 performs measurement, filtering, and averaging of a predetermined number of pulse sequences for each component of the signal at phase detector 322 (608). The results of the averaging step are tested for consistency (610) using criteria similar to those of the measurement validation process, with appropriate standard deviation limits. Measurement offsets, determined by the magnitude of the signal during time period $t_1$, are subtracted from the results of the averaging process (612). The magnitude of the signal is calculated (614) and the results are analyzed (616). Use of the signal magnitude reduces phase noise of the system and reduces sensitivity to the phase adjustment performed in reference branch 338 and resonance branch 336. The signal analysis is performed by controller 304. In one embodiment, RF bridge is fine balanced before each measurement pulse sequence.

Semiconductor Characterization Methods

It is possible to characterize a semiconductor sample by analyzing the dependence of a steady-state photoconductance on the intensity of an illumination light or by analyzing the time dependence of a photoconductance decay. For ease of explanation, the methods below are described with reference to semiconductor characterization system 300. However, it is to be understood that these methods are not limited to use only with characterization system 300; any system or apparatus that enables performance of the methods below may be used. Furthermore, the discussions and formulas herein are directed to an n-type semiconductor sample. However, the discussions and formulas could easily be converted to apply to a p-type semiconductor as well. The term 'photoconductance' is used herein to describe the sheet photoconductance of a sample. The unit for sheet photoconductance used in presenting formulas and measurement results herein is the Siemen (S).

The contribution of various types of imperfections to carrier recombination is extracted from either the steady-state photoconductance or the photoconductance decay. For instance, imperfections having different recombination characteristics or imperfections associated with different regions of a sample (e.g., a bulk of the sample or a surface of the sample) can be distinguished. The discussion herein divides imperfections into two classes based on their recombination characteristics: point imperfections and extended imperfections.

Point imperfections, or zero-dimensional (0-D) imperfections, include single-atom impurities, point defects in the crystal lattice of a sample, and small clusters including a few impurity atoms or lattice defect atoms. The photoconductance decay (that is, the decay of the photoconductance after illumination is stopped) of point imperfections is characterized by an exponential decay; the steady-state photoconductance exhibits a linear dependence on the intensity of the illumination or on the associated optical carrier generation rate. The photoconductance decay associated with point imperfections is given by $$\Delta\sigma_{0\text{-}D} = \Delta\sigma_{0\text{-}D}(0)\exp(-t/\tau_{0\text{-}D}) \qquad (1)$$

where $\Delta\sigma_{0\text{-}D}(0)$ is the steady-state photoconductance or, more generally, the initial photoconductance at time t=0, immediately at the cessation of the illumination pulse; and $\tau_{0\text{-}D}$ is the effective minority carrier recombination lifetime due to recombination at point imperfections. If various types of point imperfection recombination centers are present in a sample, the effective recombination lifetime is a combination of the lifetimes associated with each type of point imperfection.

The steady-state photoconductance associated with point imperfections is given by $$\Delta\sigma_{0\text{-}D}(0) = q(\mu_e + \mu_h)G_{0\text{-}D}\tau_{0\text{-}D} \qquad (2)$$

where q is the magnitude of the elementary charge, $\mu_e$ and $\mu_h$ are the mobilities of the electron and the hole, respectively, and $G_{0\text{-}D}$ is the generation rate in the vicinity of a point imperfection.

Extended material imperfections, also known as multi-dimensional (M-D) imperfections, include, for example, one-dimensional (1-D) defects such as edge dislocations, two-dimensional (2-D) defects such as surfaces and grain boundaries, and three-dimensional (3-D) imperfections such as large (i.e., consisting of a large number of atoms) clusters of impurities or lattice defects. Under certain conditions, extended imperfections trap majority carriers (electrons for n-type semiconductors), thus becoming charged. The charge produces an electrostatic potential barrier $\Psi_d$ at the imperfection, limiting further capture of majority carriers. In some cases, such as at a surface, a charge arises due to built-in charge, such as a fixed oxide charge at an interface between silicon and silicon dioxide. Charged extended imperfections induce a Schottky-type depletion space charge region in the vicinity of the imperfection.

Figure 8A:
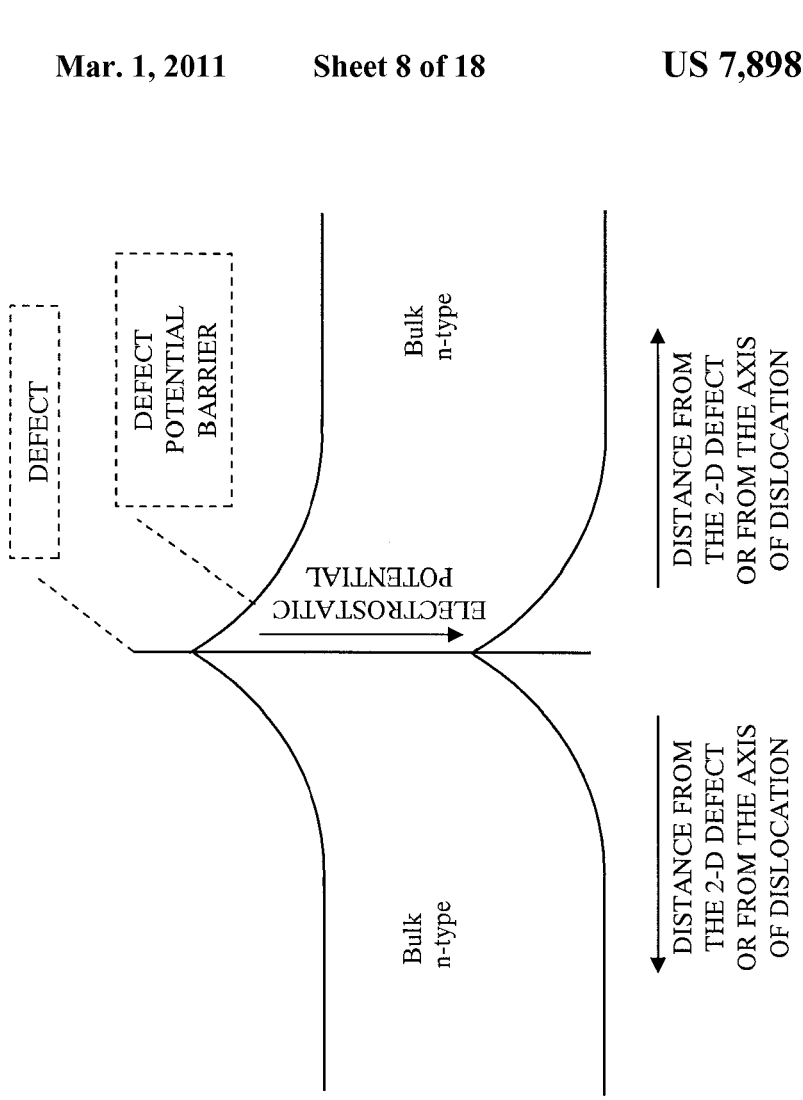
FIGS. 8A and 8B are schematic diagrams of the band structure in the vicinity of a surface (8A) or an imperfection (8B).
Figure 8B:
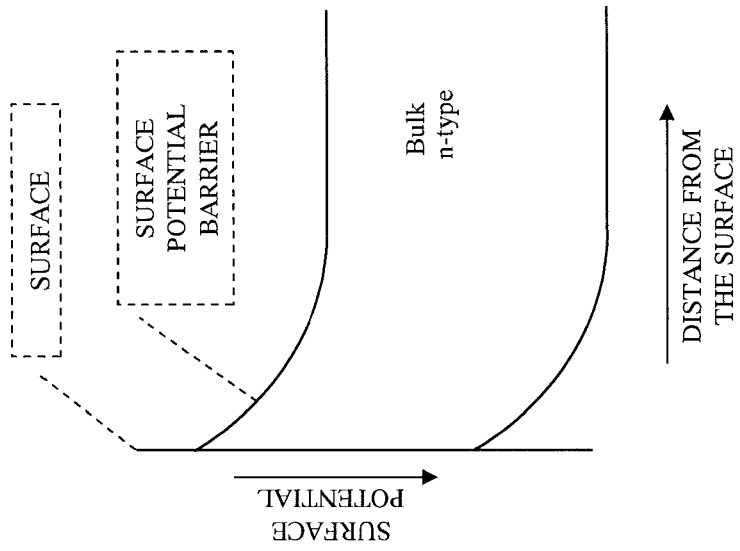

Referring to FIG. 8A, a band diagram illustrating the electrostatic potential at the surface of an n-type semiconductor shows the potential barrier as a function of distance from the surface. Referring to FIG. 8B, a band diagram illustrating the electrostatic potential at a 2-D defect in the bulk of an n-type semiconductor shows the variation of the potential barrier with distance away from the defect. In the case of a grain boundary, the distance is measured perpendicular to the grain boundary. FIG. 8B can also represent the band diagram of a 1-D defect such as an edge dislocation; in this case, the electrostatic potential has cylindrical symmetry and the distance is a radial distance from the axis of the cylinder.

Figure 9:
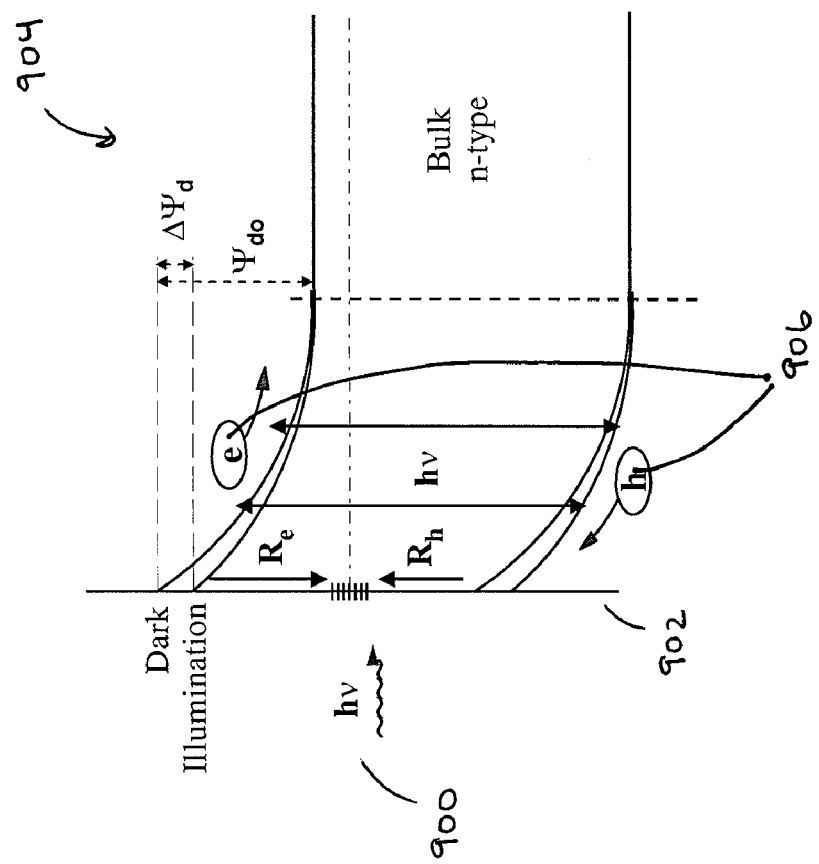
FIG. 9 is a schematic diagram of a band diagram of a semiconductor sample illuminated with a pulse of light.

Referring to FIG. 9, to perform a photoconductance measurement, an illumination pulse 900 is incident onto a surface 902 of a semiconductor sample 904. The illumination pulse generates electron-hole pairs 906 and leads to an increase in the density of free minority carriers (holes for n-type semiconductors) in the vicinity of imperfections. A strong electric field in the space charge region of an extended imperfection causes minority carriers photogenerated in the vicinity of the imperfection to be swept toward the imperfection, reducing the electrostatic potential barrier $\Psi_d$ and increasing the capture rate of majority carriers (electrons) at the imperfection. For sufficiently high carrier generation rates in the vicinity of the imperfection, the change in the potential barrier, $\Delta\Psi_d$, is much higher than the thermal energy kT, i.e., $$q\Delta\Psi_d > kT. \quad (3)$$

The control of the carrier capture rate by the height of the electrostatic potential barrier $\Psi_d$ leads to a logarithmic decay of the photoconductance associated with extended imperfections. If the carrier generation rate is not too high and thus does not substantially reduce the electrostatic potential barrier, most of the photogenerated minority carriers (holes) are captured by the imperfections and free electrons dominate the photoconductance. In this case, the photoconductance decay associated with extended imperfections is given by $$\Delta\sigma_{M-D}^H = kT\frac{\mu_e n_{t0}}{\Xi}\ln\left(\frac{t+\tau_o}{\tau_e}\right), \quad (4)$$

where time t begins at the cessation of the illumination pulse, $n_{t0}$ is the density of electrons trapped at the imperfection in thermal equilibrium (i.e., in dark conditions), and $\tau_0$ and $\tau_e$ are time constants. Time constant $\tau_0$ is given by the formula $$\tau_0 = -\frac{1}{G_{M-D}}\frac{n_{t0}}{q\Xi/kT} \quad (5)$$

and time constant $\tau_e$ is given by the formula $$\tau_e = -\frac{f_{t0}\exp(-q\Psi_{d0}/kT)}{c_e n_0 q\Xi/kT}, \quad (6)$$

where $f_{t0}$ is the probability that an imperfection state is occupied by an electron in thermal equilibrium, $\Psi_{d0}$ is the thermal equilibrium value of the electrostatic potential barrier, $c_e$ is the probability per unit time that an electron will be captured by an available imperfection site, and $n_0$ is the free electron concentration at thermal equilibrium.

For one-dimensional defects such as edge dislocations, the parameter $\Xi$ is given as $$\Xi_{1-D} = \Psi_{d0}; \quad (7)$$

for two-dimensional defects such as surfaces or grain boundaries, $\Xi$ is given by the formula $$\Xi_{2-D} = \frac{Q_{d0}n_{t0}}{\varepsilon_s N_D}, \quad (8)$$

where $Q_{d0}$ is the charge density at the defect at thermal equilibrium, $\varepsilon_s$ is the dielectric permittivity of the semiconductor material, and $N_D$ is the concentration of donors in the semiconductor. It should be noted that $\Psi_{d0}$ and $Q_{d0}$, and hence $\Xi$, are negative for n-type semiconductors; for p-type semiconductors these parameters are positive, but the polarity of Eqs. (4)-(6) is also reversed so that the resulting photoconductance and all time constants remain positive.

At high carrier generation rates, the steady-state photoconductance in the vicinity of extended imperfections is described by Eq. (4) for t=0, and can also be written as $$\Delta\sigma_{M-D}^H(0) = -kT\frac{\mu_e n_{t0}}{\Xi}\left[\ln G_{M-D} - \frac{q\Psi_{d0}}{kT} - \ln(c_e n_0 N_t)\right], \quad (9)$$

displaying a logarithmic (i.e., non-linear) dependence on the intensity of the illumination pulse.

At a sufficiently low carrier generation rate in the vicinity of an imperfection, the change in the potential barrier, $\Delta\Psi_d$, becomes much lower than the thermal energy kT, i.e., $$q\Delta\Psi_d < kT, \quad (10)$$

and the photoconductance decay in the vicinity of an extended imperfection becomes an exponential process described by the formula $$\Delta\sigma_{M-D}^L = \Delta\sigma_{M-D}^L(0)\exp(-t/\tau_e), \quad (11)$$

where $\Delta\sigma_{M-D}^L(0)$ is the photoconductance at t=0. The time constant $\tau_e$ plays effectively the same role played by the minority carrier lifetime in the photoconductance decay for point imperfections.

Steady-state photoconductance in the vicinity of extended imperfections at low carrier generation rates is described by the formula $$\Delta\sigma_{M-D}^L(0) = q\mu_e G_{M-D}\tau_e. \quad (12)$$

This formula has the same form as the formula for steady-state photoconductance associated with recombination at point imperfections; however, instead of bipolar photoconductance, it considers only photoconductance associated with majority carriers.

Steady-state photoconductance associated with extended imperfections, given by Eqs. (9) and (12), considers only the contribution of electrons (majority carriers). Depending on measurement parameters, such as the wavelength of the illumination pulse and the material properties of the sample, the steady-state photoconductance could be distorted by the presence of excess free holes (minority carriers) not trapped in the space charge region of the imperfection. Similarly, the photoconductance decay, given by Eqs. (4) and (11), considers only the contribution of electrons. Depending on the measurement configuration, there could still be remnant holes outside of the imperfection space charge region at the first moment after the illumination pulse is stopped. However, these remnant holes would rapidly drift toward the space charge region and, a short time after the beginning of the relaxation, the decay process would be governed essentially by the rate of electron capture.

EXAMPLE 1

Figure 10:
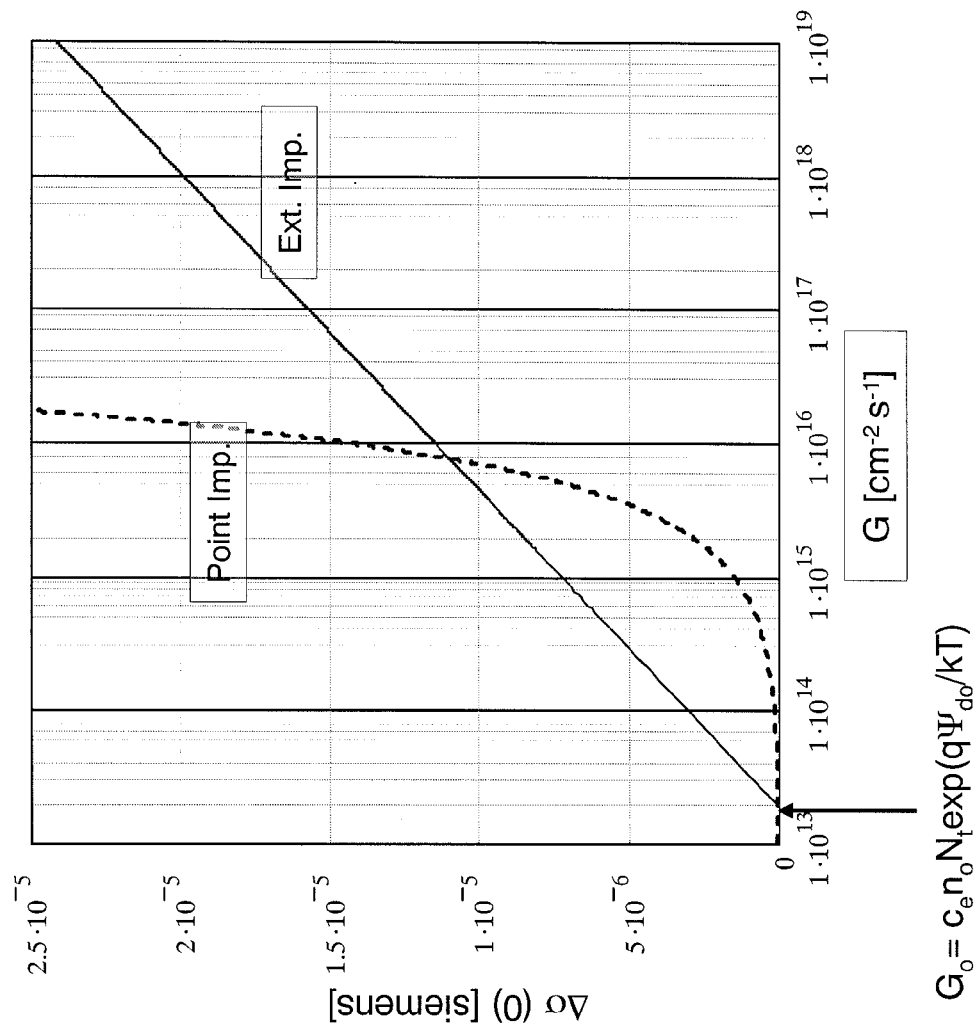
FIG. 10 is a graph showing the dependence of the steady-state photoconductance on the carrier generation rate (illumination intensity) for extended and point imperfections.

Referring to FIG. 10, the calculated dependence of the steady-state photoconductance on the carrier generation rate is shown for a sample having material parameters as follows: $n_o=10^{15}$ cm$^{-3}$, $\Psi_{d0}=-0.4$ V, $Q_{d0}=-2\times10^{10}$ q/cm$^2$, $N_t=1\times10^{11}$ cm$^{-2}$, $c_e=9.65\times10^{-7}$ cm$^3$/s, $f_{t0}=0.1$ and $\tau_b=10$ µs. A logarithmic dependence of the photoconductance on illumination intensity is observed. At zero photoconductance (i.e., $\Delta\sigma_{M\text{-}D}^H(0)=0$), the generation rate $G_0$ can be determined from Eq. (9):

$$G_0 = c_e n_0 N_t \exp(q\Psi_{d0}/kT). \quad (13)$$

The linear dependence shown for comparison represents light intensity dependence of the steady-state photoconductance associated with point imperfections. It demonstrates that linear photoconductance would dominate at high enough intensities while photoconductance associated with extended imperfections would dominate at low intensities.

EXAMPLE 2

Figure 11:
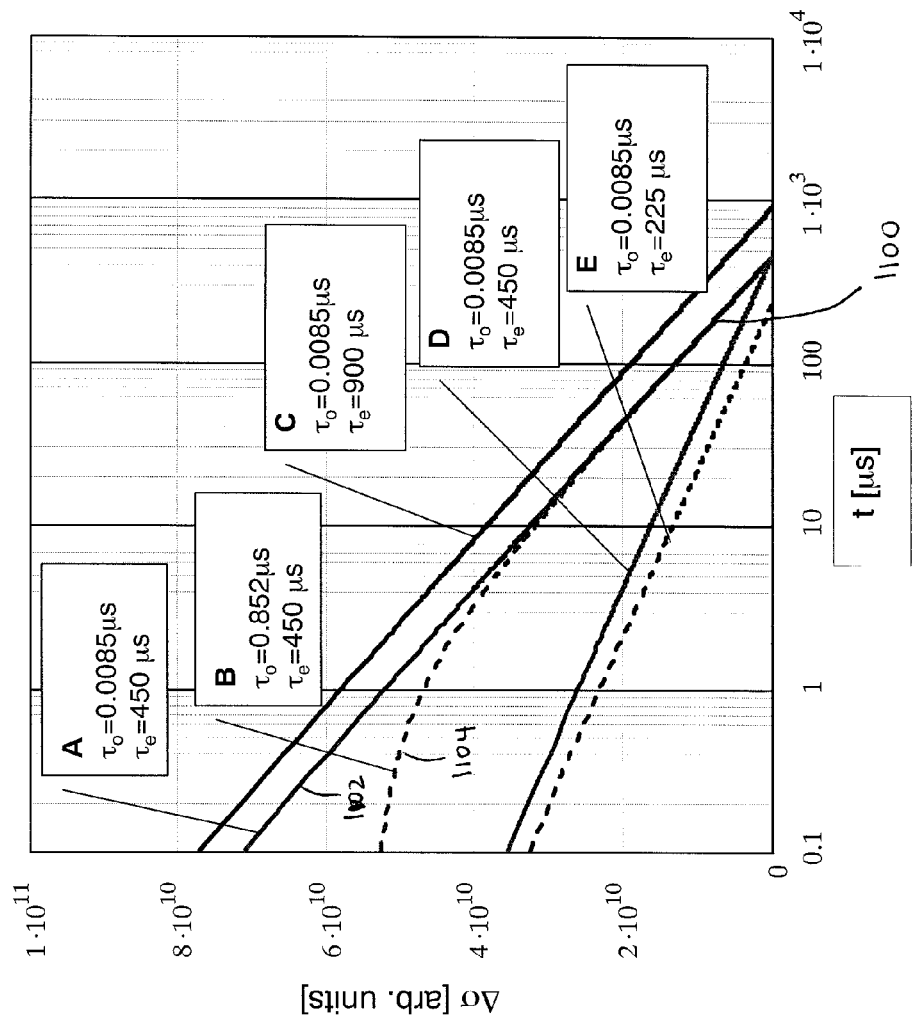
FIG. 11 is a graph showing the photoconductance decay for various sample parameters.

Referring to FIG. 11, the calculated photoconductance decay following a high intensity illumination pulse is shown in semi-log scale for five sets of sample parameters, given in Table 1. The five decay curves illustrate the effect of various material parameters on the photoconductance decay.

TABLE 1

|  | Curve A | Curve B | Curve C | Curve D | Curve E |
|---|---|---|---|---|---|
| G (cm$^{-2}$s$^{-1}$) | $10^{18}$ | $10^{16}$ | $10^{18}$ | $10^{18}$ | $10^{18}$ |
| $N_D$ (cm$^{-3}$) | $10^{15}$ | $10^{15}$ | $10^{15}$ | $5\times 10^{14}$ | $10^{15}$ |
| $Q_{d0}$ (q/cm$^2$) | $-2\times 10^{10}$ | $-2\times 10^{10}$ | $-2\times 10^{10}$ | $-2\times 10^{10}$ | $-4\times 10^{10}$ |
| $\Psi_{d0}$ (V) | −0.4 | −0.4 | −0.4 | −0.4 | −0.4 |
| $N_t$ (cm$^{-2}$) | $1\times 10^{11}$ | $1\times 10^{11}$ | $5\times 10^{10}$ | $1\times 10^{11}$ | $1\times 10^{11}$ |
| $c_e$ (cm$^3$/s) | $9.65\times 10^{-7}$ | $9.65\times 10^{-7}$ | $9.65\times 10^{-7}$ | $9.65\times 10^{-7}$ | $9.65\times 10^{-7}$ |
| $f_{t0}$ | 0.1 | 0.1 | 0.1 | 0.1 | 0.1 |

Curves A and B both have a logarithmic portion 1100 with the same slope which, for extended imperfections, is determined based on Equation (4) to be $$\varepsilon_s \mu_e kT \frac{N_D}{Q_{d0}}, \quad (14)$$

thus indicating that curves A and B correspond to samples having the same $N_D/Q_{d0}$ (doping concentration over defect charge density) ratio. Both curves are also characterized by the same time constant $\tau_e$ which, for two-dimensional defects, can be written following Equation (6) as $$\tau_e = -\frac{kT}{q} \frac{\varepsilon_s \exp(-q\Psi_{d0}/kT)}{c_e N_t Q_{d0}}, \quad (15)$$

indicating that the same electronic properties of the defects are responsible for carrier recombination. The only difference between curves A and B is the generation rate G. The difference in generation rate gives rise to different time constants $\tau_0$ which, for two-dimensional defects, can be written following Equation (5) as $$\tau_0 = -\frac{kT}{q} \frac{N_D}{Q_{d0}} \frac{\varepsilon_s}{G_{2\text{-}D}}. \quad (16)$$

Comparison of curves A and B shows that the initial decay of the photoconductance, shown in a region 1102 of curve A and a region 1104 of curve B, strongly depends through $\tau_0$ on the generation rate G. This initial portion of the decay is followed by the logarithmic region 700 described by Equation (4) and subsequently by an exponential decay (not shown) described by Equation (11).

Curves A and B demonstrate that, under high illumination conditions, the photoconductance decay does not follow the exponential decay pathway conventionally considered in photoconductance decay measurements. Furthermore, it shows that the slope of a decay curve does not necessarily characterize the decay. In particular, the initial slope of the decay (e.g., regions 1102 and 1104 of curves A and B) is determined by steady-state conditions and depends on the carrier generation rate. The recombination rate, or capture rate, is determined by the time at which a linear (in a semi-log plot) extension of the logarithmic portion of the decay crosses zero photoconductance.

Curves A and B were calculated using a density of defect traps, $N_t$, of $10^{11}$ cm$^{-2}$ and a probability of electron capture, $c_e$, of $9.65\times10^{-7}$ cm$^3$/s, the latter of which corresponds to a typical electron capture cross section for defect states present at an interface between silicon and silicon dioxide. To illustrate the effect of the electronic properties of two-dimensional defect states on the photoconductance decay, curve C was calculated using the same generation rate as curve A but with the density of defect traps reduced by a factor of two. The photoconductance decay is also affected by the defect charge density, $Q_{d0}$, and the doping concentration, $N_D$, in the region surrounding the imperfections. Curve D corresponds to a sample having the same generation rate as curve A but with the defect charge density increased by a factor of two; curve E has the doping concentration decreased by a factor of two.

The above-described dependence of the photoconductance on material properties can be used as a basis for materials characterization. In particular, in addition to or instead of considering exponential decay and linear dependence of the photoconductance on the illumination intensity (known as a linear or low-intensity approximation and corresponding to the low-excitation case discussed above), the non-linear photoconductance behavior characterized by non-exponential decay and non-linear dependence of the photoconductance on the illumination intensity is used to extract material properties from a photoconductance measurement. The following sections describe three embodiments demonstrating specific applications of the above method. The data analysis in the embodiments below may be performed automatically by controller 304 shown in FIG. 3.

Surface Characterization

In one embodiment, electronic properties of a surface of a semiconductor sample are characterized by photoconductance measurements of the sample. Before measurement, the sample is prepared for analysis by forming a depletion or inversion layer at the surface. Some samples may already possess a surface charge sufficient to induce a depletion or inversion layer due to previous processing; other samples are treated with a chemical treatment or by deposition of a corona charge. In silicon, chemical treatment with SC-1 or HF, depending on the sample type (i.e., n- or p-type), is conventionally used for such treatment. In one embodiment, surface preparation is performed before the sample is placed in the characterization system. Alternatively, the surface may be charged using corona discharge by the characterization system during measurement. In one embodiment, the corona charging conditions required for achieving surface inversion are established empirically by gradually depositing ionic corona charge and measuring either $\tau_e$ or the steady-state photoconductance; a stable value of $\tau_e$ or of the steady-state photoconductance indicates that inversion conditions have been established at the surface. Since $\tau_e$ depends exponentially on the height of the surface potential barrier, monitoring $\tau_e$ results in a more accurate determination of inversion than monitoring of the steady-state photoconductance.

The wavelength of the illumination pulse is selected to be sufficiently short so as to generate electron-hole pairs predominantly in the vicinity of the surface, so that all minority carriers are swept into the surface space charge region. For silicon, a diode laser emitting around 400 nm would provide sufficient illumination; however, even at longer wavelengths, such as 660 nm, the light absorption in the vicinity of the surface is sufficient to ensure dominance of the surface region. The intensity of the illumination and the length of the illumination pulse are selected to provide an excitation level (i.e., a total density of excess carriers) sufficient to change the surface potential barrier by an amount greater than the thermal energy (i.e., the situation of Eq. (3)) but low enough to ensure that the surface potential barrier remains substantially higher than the thermal energy. Since the photoconductance associated with the surface as an extended imperfection depends logarithmically on the intensity of illumination (see Eq. (9)) and the photoconductance associated with point imperfections in the bulk depends linearly on the illumination intensity (see Eq. (2)), reducing the carrier injection level (i.e., decreasing the illumination intensity) results in a decreased contribution of the bulk to the measured photoconductance (see FIG. 10).

Under such conditions, using Eqs. (4)-(6) and the expression for $\Xi_{2-D}$, the photoconductance decay can be expressed in a more explicit form given by the formula $$\Delta \sigma_S^H = \varepsilon_s kT \frac{\mu_e N_D}{Q_{d0}} \ln\left(\frac{t + \tau_0}{\tau_e}\right), \text{ where} \quad (17)$$

$$\tau_0 = -\frac{kT}{q} \frac{1}{G} \frac{\varepsilon_s N_D}{Q_{d0}} \text{ and} \quad (18)$$

$$\tau_e = -\frac{kT}{q} \frac{\varepsilon_s \exp(-q\Psi_{d0}/kT)}{c_e N_t Q_{d0}} \quad (19)$$

and where it is assumed that, at room temperature, $n_0 = N_D$.

The steady-state photoconductance described by Eq. (9) can be rewritten as $$\Delta \sigma_S^H(0) = -\varepsilon_s kT \frac{\mu_e N_D}{Q_{s0}} \left[\ln G - \frac{q\Psi_{s0}}{kT} - \ln(c_e n_0 N_t)\right] \quad (20)$$

for the above conditions, where $Q_{s0}$ and $\Psi_{s0}$ are the surface charge and the height of the surface potential barrier, respectively, at thermal equilibrium.

The measurement conditions are pre-established empirically by verifying that the photoconductance decay includes a logarithmic decay segment. The length of the pulse is selected to achieve steady-state photoconductance during illumination. In other embodiments, the pulse length is shorter than the duration required to achieve steady-state conditions.

Figure 12:
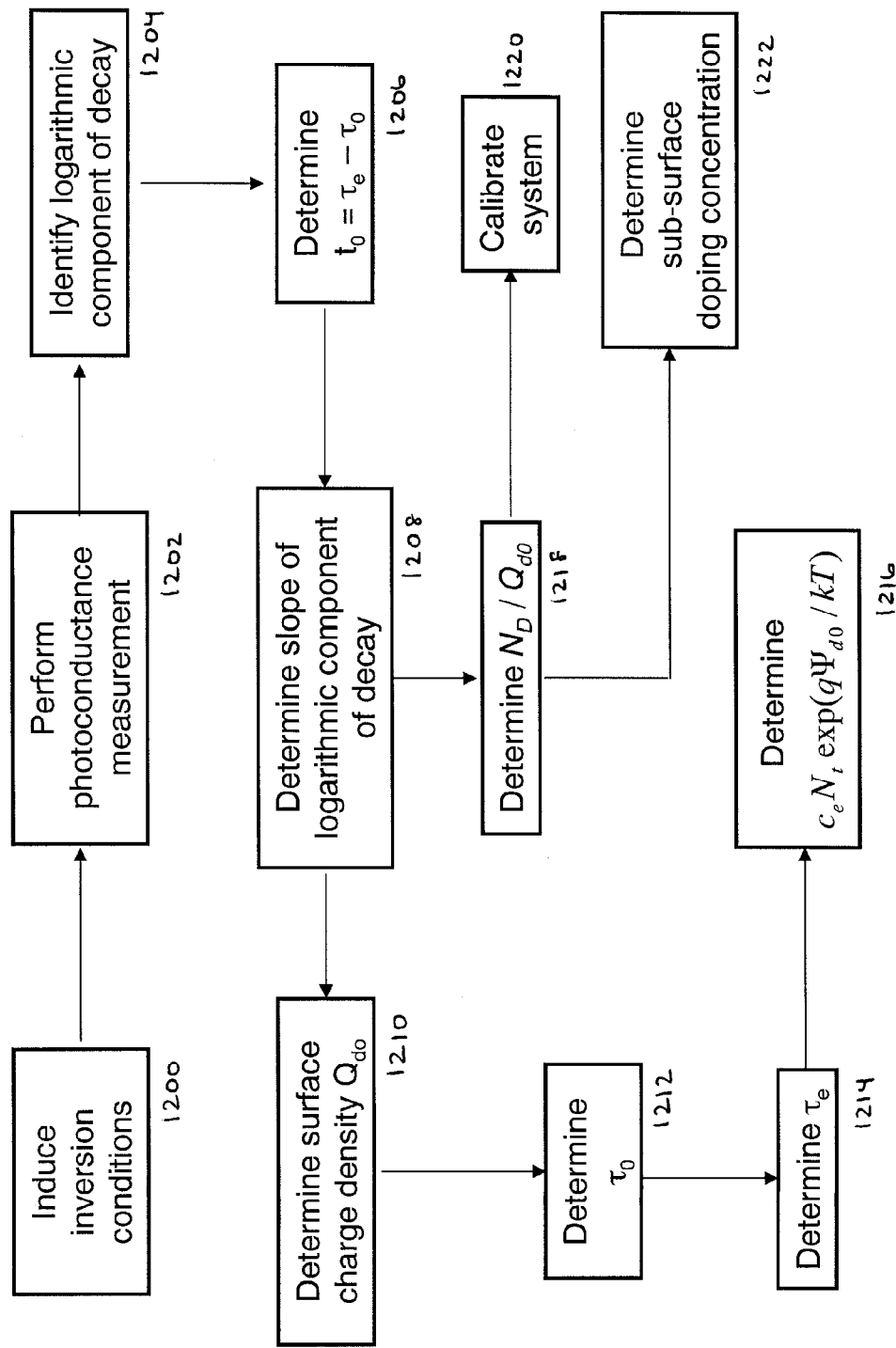
FIG. 12 is a flow diagram illustrating the procedure to determine parameters characterizing electronic properties of a surface of a semiconductor sample.

Referring to FIG. 12, the procedure to determine electronic properties characterizing a surface of a semiconductor sample is shown. Inversion conditions are induced (1200) and a photoconductance measurement is performed (1202) as described in FIG. 6. A logarithmic component of the photoconductance decay is identified (1204). By linearly extending the logarithmic component of the photoconductance decay to a value of zero photoconductance ($\Delta\sigma_{M-D}^H = 0$), the value of $t_0 = \tau_e - \tau_0$ is determined (1206). The slope of the logarithmic component of the photoconductance decay in a semi-log scale, i.e., $\Delta\sigma$ vs. log t, is calculated (1208) from Eq. (17) to be $$\frac{d}{d(\ln t)}(\Delta\sigma_S^H) = \varepsilon_s kT \frac{\mu_e N_D}{Q_{d0}}. \quad (21)$$

Using known material parameters, such as $\varepsilon_s$, $\mu_e$, and $N_D$ (for n-type semiconductors), the slope of the logarithmic component is used to determine the thermal equilibrium value of the surface charge density $Q_{d0}$ (1210). Alternatively, the surface charge density $Q_{d0}$ is determined from the slope of the dependence of the steady-state photoconductance on the generation rate (ln G in Eq. (20)). Using known material parameters, the independently determined carrier excitation rate G, and the surface charge density $Q_{d0}$ determined in step 1210, $\tau_0$ is determined from Eq. (17) (1212). From $t_0$ and $\tau_0$, $\tau_e$ is then determined (1214). For sufficiently high illumination intensities, $\tau_0$ becomes negligible and $t_0$ gives the value of $\tau_e$ directly. From these calculated parameters, the value of $c_e N_t \exp(q\Psi_{d0}/kT)$ can be determined (1216). Alternatively, $c_e N_t \exp(q\Psi_{d0}/kT)$ is calculated from the dependence of the steady-state photoconductance on the generation rate G. Following Eq. (20), a linear extension (in semi-log scale) of the logarithmic component of the photoconductance decay to the point at which this extension crosses zero photoconductance (see FIG. 10) gives $$c_e N_t \exp(q\Psi_{d0}/kT) = G_0/n_0. \quad (22)$$

The parameter $c_e N_t \exp(q\Psi_{d0}/kT)$ can be simplified by pre-charging the surface into inversion conditions using chemical treatment or corona charging. Since the value of $\Psi_{d0}$ under inversion is known, $c_e N_t$ can be directly determined.

System Calibration and Determination of the Subsurface Doping Concentration

The above procedure for surface characterization can be used for system calibration and determination of a subsurface doping concentration. Determination of the subsurface doping concentration using surface photovoltage methods is commonly used by silicon wafer manufacturers. This approach requires inversion conditions (a maximum depletion layer width) induced by chemical treatment or corona charging. The method presented herein enables this approach to be extended to thinner wafers and thin films. It also offers a more complete characterization of the sample, including determination of the bulk recombination lifetime, described below, in a rapid and non-destructive manner.

Referring again to FIG. 12, for system calibration or the determination of the subsurface doping concentration, inversion conditions are induced at the surface as described above, if necessary (1200). A photoconductance measurement is performed (1202) and a logarithmic component of the photoconductance decay is identified as described above (1204). The slope of the logarithmic component of the photoconductance decay in a semi-log scale is calculated (1208) as given in Eq. (21). After determination of the slope of the photoconductance decay, the ratio $N_D/Q_{d0}$ is determined (1218) from the formula $$\frac{N_D}{Q_{d0}} = -\sqrt{\frac{N_D}{4\varepsilon_s kT\ln(N_D/n_i)}}, \quad (23)$$

where $Q_{d0}$ is the surface charge density and $n_i$ is an intrinsic carrier density. Equation (23) applies to n-type semiconductors having surface inversion; for p-type semiconductors, the polarity of the surface charge is positive and the right side of Equation (23) does not have a negative sign. Since the slope of the logarithmic component of the photoconductance decay depends only on basic material parameters and on the subsurface doping concentration (that is, doping within the surface space charge region), the slope can be used either to calibrate the system (1220), if doping concentration is known, or to determine the doping concentration for a previously calibrated system (1222).

EXAMPLE 3

Figure 13:
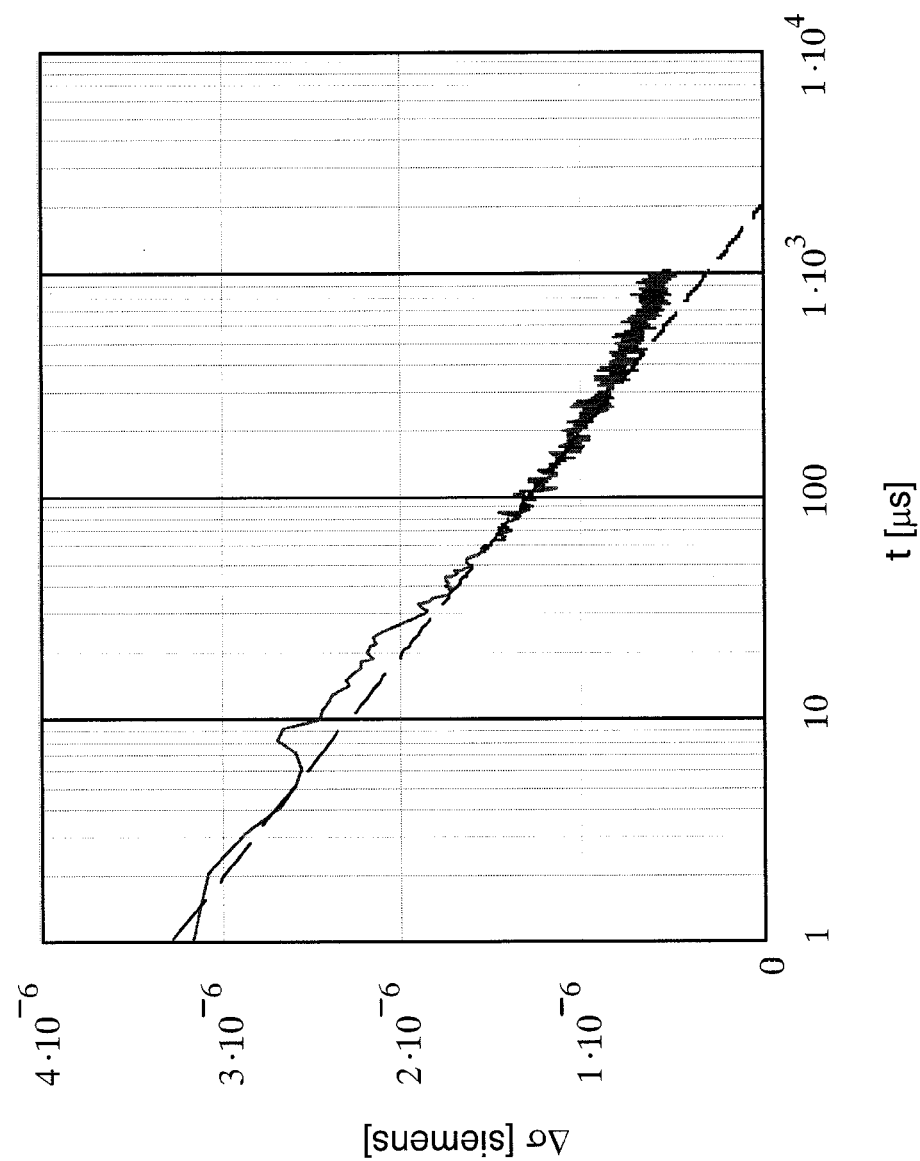
FIG. 13 is a graph showing a photoconductance decay curve used to calibrate a characterization system.

Referring to FIG. 13, a photoconductance decay curve for n-type silicon with a known doping concentration $N_D=1.06 \times 10^{15}$ cm$^{-3}$ illuminated with light at a wavelength of 660 nm is shown. The curve was determined with a four-point probe measurement. The slope of the curve was used to calibrate the characterization system according to Eq. (23).

EXAMPLE 4

Figure 14:
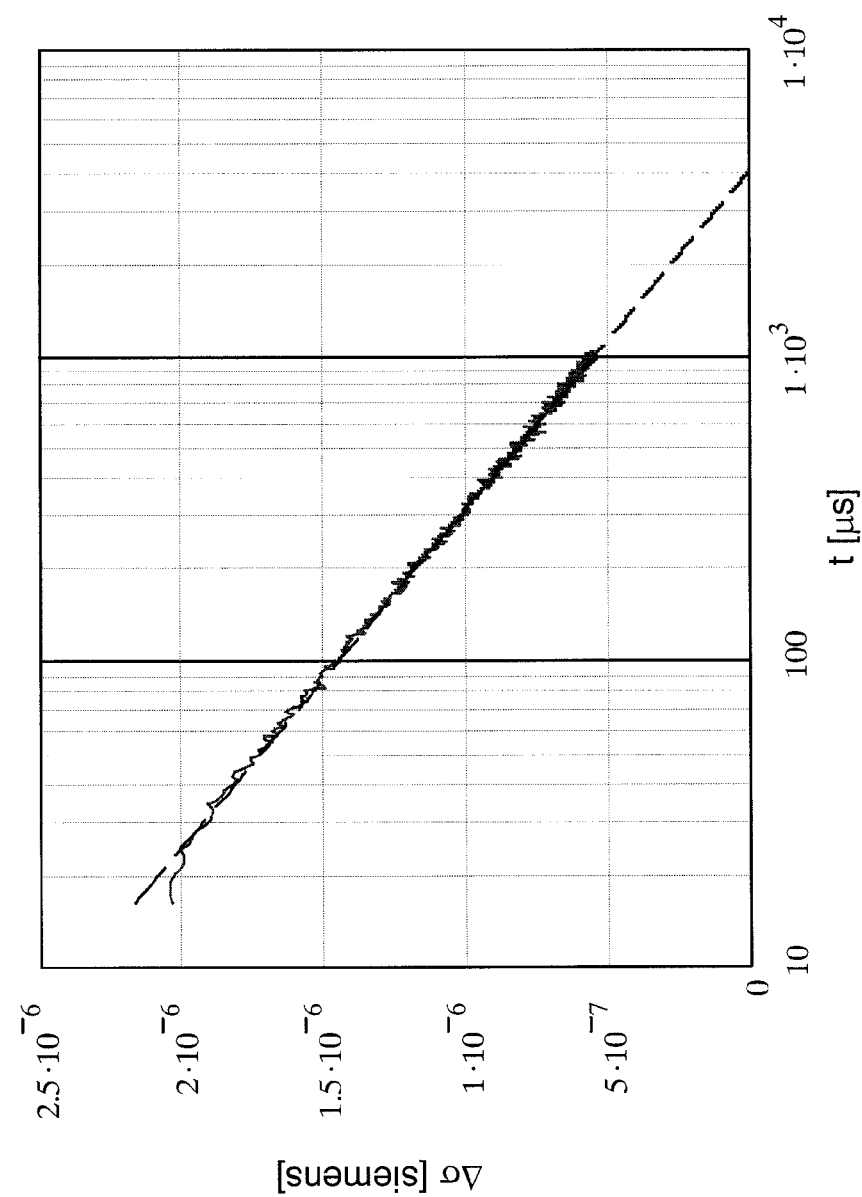
FIG. 14 is a graph showing a photoconductance decay curve used to determine a subsurface doping concentration.

Referring to FIG. 14, a photoconductance decay measurement of an n-type silicon sample with a resistivity of 5.5 Ω-cm (as specified by the manufacturer) was performed using the characterization system calibrated as shown in FIG. 13. Prior to measurement, the sample was treated with an SC-1 cleaning solution to induce surface inversion. The subsurface doping concentration as determined from the slope of the logarithmic component of the photoconductance decay was $8.6 \times 10^{14}$ cm$^{-3}$ and $\tau_e$ was determined to be 3.9 ms, in excellent agreement with the manufacturer specifications.

Cleaning Process Monitoring

In one embodiment, the method for surface characterization described above is used to monitor surface cleaning and etching processes. This Defect-Specific Photoconductance (DSPC) technique is based on a non-linear RF-photoconductance measurement that monitors such processes.

EXAMPLE 5

The density of surface traps (i.e., surface states) was calculated for the two samples depicted in FIGS. 13 and 14. Using $N_D$ and determining $\tau_e$ from Eq. (17) allows the determination of $c_e N_t$. Assuming that surface traps in the samples of both FIGS. 13 and 14 are characterized by the same $c_e$, the density of surface traps $N_t$ can be determined and thus the quality of the surface can be quantitatively characterized. The results are summarized in Table 2. The sample of FIG. 14 has a higher quality surface than the sample of FIG. 13, as indicated by the density of surface traps in each sample.

TABLE 2

|  | Sample of FIG. 13 | Sample of FIG. 14 |
| --- | --- | --- |
| Doping Concentration, $N_D$ [cm$^{-3}$] | $1.06 \times 10^{15}$ | $8.3 \times 10^{14}$ |
| Surface Charge Density, $Q_{s0}$ [q/cm$^2$] | $-9 \times 10^{10}$ | $-7.87 \times 10^{10}$ |
| Time Constant $\tau_e$ [ms] | 2.0 | 4.1 |
| $c_e \times N_t$ [cm/s] | $5.06 \times 10^6$ | $2.47 \times 10^6$ |
| $N_t$ [1/cm$^2$] (for $c_e = 9.65 \times 10^{-7}$) | $5.24 \times 10^{12}$ | $2.56 \times 10^{12}$ |

Separation of Bulk and Surface Properties

In another embodiment, both bulk and surface properties of a semiconductor sample are characterized simultaneously without surface passivation.

The wavelength of the illumination pulse is selected to be sufficiently energetic so as to generate electron-hole pairs beyond the surface space charge region and into the bulk of the sample. The intensity of the illumination and the length of the illumination pulse are selected to provide an excitation level (i.e., a total density of excess carriers) sufficient to change the surface potential barrier by an amount greater than the thermal energy but low enough to ensure that the surface potential barrier remains substantially higher than the thermal energy. Since the photoconductance associated with the surface depends logarithmically on the intensity of illumination (see Eq. (9)) and the photoconductance associated with point imperfections in the bulk depends linearly on the illumination intensity (see Eq. (2)), adjustment of the carrier injection level (i.e., the illumination intensity) allows the bulk and surface contributions to the measured photoconductance to be balanced. Since surface effects dominate at low illumination intensities (see FIG. 10), increasing the measurement sensitivity by using a higher illumination intensity requires the selection of an illumination wavelength sufficiently short to assure strong surface photoconductance, so that the logarithmic decay associated with surface recombination is not overwhelmed by the bulk photoconductance.

The measurement conditions are pre-established empirically by verifying that the photoconductance decay includes a logarithmic component and an exponential component. The length of the pulse is selected to achieve steady-state photoconductance during illumination. In other embodiments, the pulse is shorter than the duration required to achieve steady-state photoconductance.

Under these conditions, the overall photoconductance is equal to the sum of the photoconductance associated with surface recombination (described by Eq. (17)) and that associated with the bulk. Assuming that bulk recombination is dominated by point imperfections (characterized by Eqs. (1) and (2)), the overall photoconductance is given as $$\Delta\sigma = \varepsilon_s kT \frac{\mu_e N_D}{Q_{d0}} \ln\left(\frac{t+\tau_o}{\tau_e}\right) + q(\mu_e + \mu_h)G_b\tau_b\exp(-t/\tau_b), \quad (24)$$

where $$\tau_0 = -\frac{kT}{q}\frac{1}{G_{sc}}\frac{\varepsilon_s N_D}{Q_{d0}} \text{ and} \quad (25)$$

$$\tau_e = -\frac{kT}{q}\frac{\varepsilon_s \exp(-q\Psi_{d0}/kT)}{c_e N_t Q_{d0}}. \quad (26)$$

$G_{sc}$ is the generation rate in the surface region, $G_b$ is the generation in the bulk (both having units of 1/cm²s), and $\tau_b$ is the effective recombination lifetime in the bulk. The overall generation rate is given by $$G = G_{sc} + G_b. \quad (27)$$

The ratio of $G_{sc}$ to $G_b$ depends on the wavelength of the illumination pulse and on material properties such as doping concentration, surface properties, and bulk diffusion properties. In one embodiment, surface and bulk effects are distinguished by illuminating the sample with two consecutive pulses, each having a different wavelength, and analyzing the subsequent photoconductance decay resulting from each pulse. Alternatively, more than one wavelength can be contained in a single illumination pulse.

EXAMPLE 6

Figure 15:
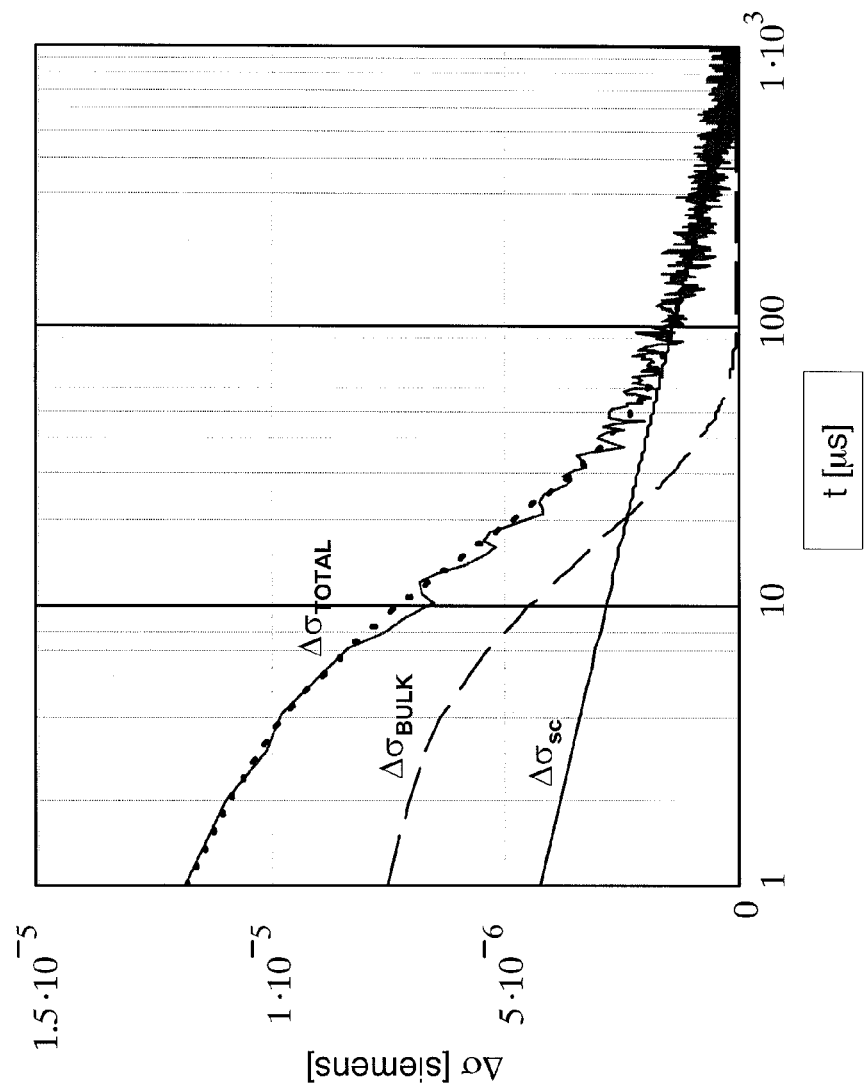
FIG. 15 is a graph illustrating a photoconductance decay curve.

Referring to FIG. 15, a photoconductance decay after a 660 nm illumination pulse under the above measurement conditions is shown for p-Si (~10 Ω-cm) after HF treatment. The solid line marked $\Delta\sigma_{TOTAL}$ shows the overall photoconductance decay; the line marked $\Delta\sigma_{sc}$ indicates the surface contribution to the photoconductance decay. In this case, the intensity of the illumination pulse was selected to be high enough to minimize the value of $\tau_0$ (see Eq. (16)) so that its effect on the photoconductance decay is negligible. In one embodiment, the intensity of the illumination pulse is selected by measuring the bulk lifetime $\tau_b$ for increasing illumination intensities until the bulk lifetime reaches a constant value. For example, for the sample illustrated in FIG. 15, the effect of $\tau_0$ on the photoconductance decay can be neglected above generation rates of about $5\times10^{17}$ cm$^{-2}$s$^{-1}$ for bulk lifetimes greater than about 1 µs.

Figure 16:
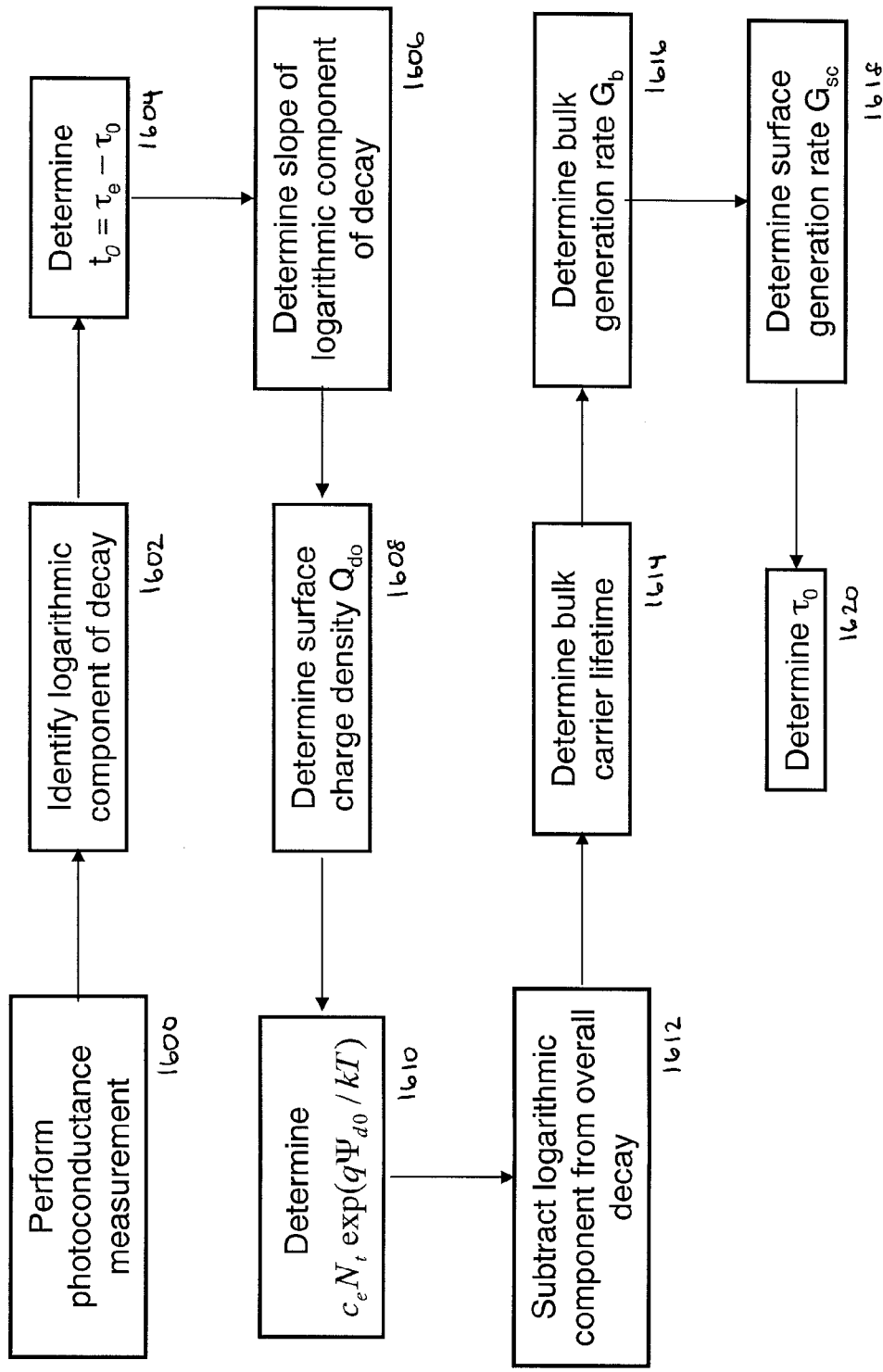
FIG. 16 is a flow diagram illustrating a procedure for determining parameters characterizing electronic properties of bulk and surface regions of a semiconductor sample.

Referring to FIG. 16, a procedure for determining parameters characterizing electronic properties of bulk and surface regions of a semiconductor sample is shown. After performing a photoconductance measurement as described in FIG. 4 (1600), the logarithmic component of the photoconductance decay is identified (1602). From the intersection of a linear (in a semi-log scale) extension of the logarithmic component with zero photoconductance, $t_0 = \tau_e - \tau_0$ is determined (1604). For sufficiently high illumination intensities, $\tau_0$ becomes negligible and $t_0$ gives the value of $\tau_e$ directly. The slope of the logarithmic component of the photoconductance decay in a semi-log scale, i.e., $\Delta\sigma$ vs. log t, is determined (1606) from Eq. (17) and is given in Eq. (21). Using known material parameters, such as $\varepsilon_s$, $\mu_e$, and $N_D$ (for n-type semiconductors), the slope is used to determine the thermal equilibrium value of the surface charge density $Q_{d0}$ (1608). From $Q_{d0}$ and $\tau_e$, the value of $c_e N_t \exp(q\Psi_{d0}/kT)$ can be determined (1610). The parameter $c_e N_t \exp(q\Psi_{d0}/kT)$ can be simplified by pre-charging the surface into inversion conditions using chemical treatment or corona charging. Since the value of $\Psi_0$ under inversion is known, $c_e N_t$ can be directly determined. Using known material parameters, $Q_{d0}$, and $\tau_e$, the logarithmic (surface) component of the photoconductance decay is numerically calculated and subtracted from the overall photoconductance decay (1612) to give the exponential (bulk) component of the photoconductance decay.

Figure 17:
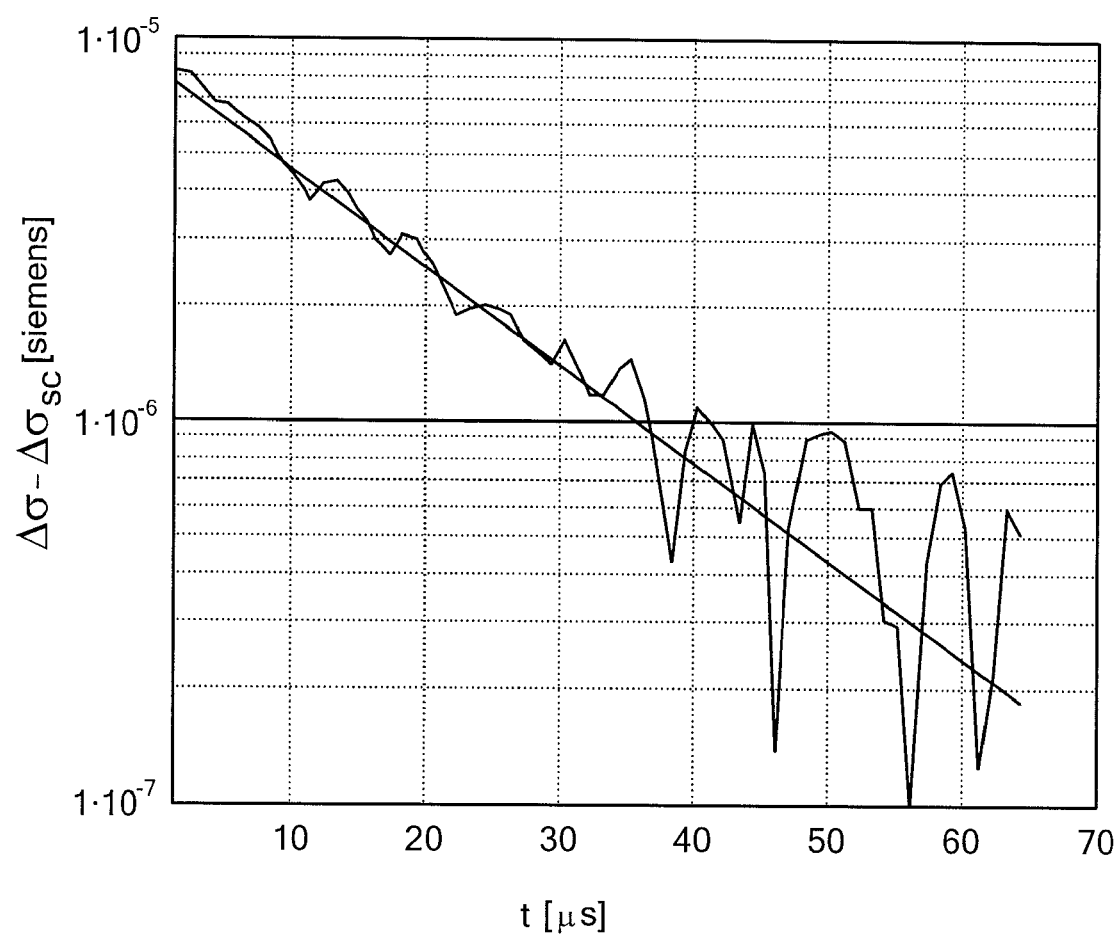
FIG. 17 is a graph showing the bulk component of a photoconductance decay.

Referring to FIG. 17, the bulk component of the photoconductance decay, obtained by subtracting the logarithmic component from the overall photoconductance decay ($\Delta\sigma_{BULK} = \Delta\sigma_{TOTAL} - \Delta\sigma_{sc}$) given in FIG. 15, is shown. The solid straight line illustrates calculated exponential decay for $G_b = 3.2\times10^{15}$ cm$^{-2}$s$^{-1}$ and $\tau_b = 17$ µs Referring again to FIG. 15, the result of the subtraction in step 1612 yields the exponential component of the photoconductance decay. From the slope of the exponential component, the effective minority carrier lifetime in the bulk is determined (1614). Using known carrier mobilities, the magnitude of the exponential component is used to determine the bulk generation rate $G_b$ (1616). The surface generation rate $G_{sc}$ is then determined using Eq. (27), where the total generation rate G is determined independently using a calibrated photodetector (1618). Using $Q_{d0}$ and $G_{sc}$ determined in steps 1208 and 1218, respectively, and known material properties $N_D$ and $\epsilon_s$, Eq. (16) is used to determine the value of $\tau_0$ (1620). As shown in FIG. 15, the dotted line represents the calculated total photoconductance as a sum of the surface ($\Delta\sigma_{sc}$) and bulk ($\Delta\sigma_{BULK}$) components calculated with $N_A = 1\times10^{15}$ cm$^{-3}$, $G_{sc} = 1\times10^{19}$ cm$^{-2}$s$^{-1}$, $G_b = 3.2\times10^{15}$ cm$^{-2}$s$^{-1}$, $\tau_b = 17$ µs, $Q_{d0} = 2\times10^{10}$ q/cm² and $\tau_e = 0.9$ ms.

Contribution of Point and Extended Imperfections

The photoconductance measurements described above are useful for the characterization of semiconductor samples and for the monitoring and identification of various types of material imperfections. The method is particularly suitable for characterization of multi-crystalline semiconductors. In solar grade multicrystalline semiconductors such as silicon, the carrier lifetime is degraded due to both grain boundaries and chemical contaminants such as metals. These two sources of degradation are caused by different factors. The size of crystallites in the sample, which defines the density of centers associated with grain boundaries, depends to a large extent on parameters of the manufacturing process, whereas the concentration and type of contaminants depends on both processing and the purity of the starting material (e.g., polycrystalline silicon). Therefore, separating the contribution of these two types of imperfections is critical for photovoltaic manufacturing.

In one embodiment, the contribution to recombination properties and carrier lifetimes by point imperfections and extended imperfections can be distinguished. The procedure for distinguishing the contribution from each type of imperfection is closely related to the procedures described above. In this embodiment, the wavelength of the illumination pulse is selected to generate electron-hole pairs throughout the bulk of the sample. That is, the energy of the illumination pulse must be greater than the band gap of the semiconductor but sufficiently close to the main absorption edge of the sample so as to allow penetration of the light deep into the bulk of the sample. The intensity of the illumination and the length of the illumination pulse are selected to provide an excitation level (i.e., a total density of excess carriers) sufficient to change the surface potential barrier by an amount greater than the thermal energy but low enough to ensure that the surface potential barrier remains substantially higher than the thermal energy. Since the photoconductance associated with extended imperfections depends logarithmically on the intensity of illumination (see Eq. (9)) and the photoconductance associated with point imperfections depends linearly on the illumination intensity (see Eq. (2)), adjustment of the carrier injection level (i.e., the illumination intensity) allows contributions of point and extended imperfections to the measured photoconductance to be balanced.

The measurement conditions are pre-established empirically by verifying that the photoconductance decay includes a logarithmic component and an exponential component. The length of the pulse is selected to achieve steady-state photoconductance during illumination. In other embodiments, the pulse is shorter than the duration required to achieve steady-state photoconductance.

If necessary, the sample is prepared for analysis by passivation of a surface of the sample. Some samples may already be passivated due to previous processing. Passivation of, for example, silicon could be done by chemical treatment with SC-1 or HF depending on semiconductor conductivity type (p or n) or iodine passivation, which are conventionally used for such treatments. In one embodiment, surface preparation is done before the specimen is placed in the sample holder, e.g., by chemical treatment or by depositing a corona charge. Alternatively the specimen may be charged by the semiconductor characterization system during measurement.

Once the surface is passivated, the procedure described in FIG. 16 is followed, with the surface terms replaced by terms representing grain boundaries of the sample. In this way, recombination parameters associated with grain boundaries (i.e., surface properties) and point imperfections (i.e., bulk properties) are determined. A ratio of $G_b$ to $G_{sc}$ gives the ratio of the volume of the sample where bulk point imperfections dominate to the volume where grain boundaries dominate the recombination properties. In another embodiment, the contribution of large 3-D clusters of impurities is distinguished from the contribution of point imperfections.

In this alternative embodiment, distinguishing contributions of the extended and point imperfections in the bulk to the recombination properties of semiconductor specimen is accomplished without surface passivation. In effect, this embodiment allows distinguishing contributions of both bulk point and bulk extended imperfections as well as the surface. Unlike the previous alternative, this embodiment requires the use of two series of pulses of different photon energy and different intensity. If two sources are used, their illumination could be combined into one optical fiber and delivered to the specimen through the fiber with the probe of FIG. 2.

Figure 18:
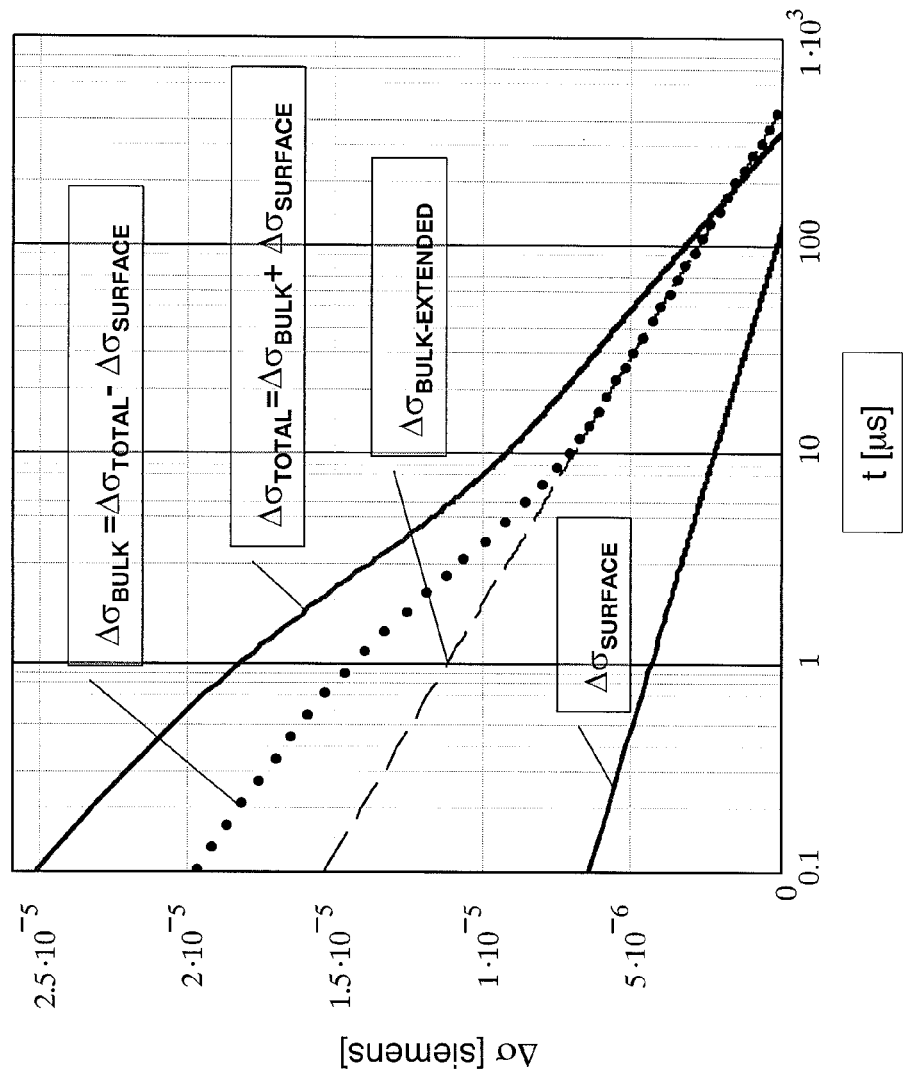
FIG. 18 is a graph illustrating simultaneous characterization of the bulk comprising point and extended imperfections and the surface.

In this embodiment, characterization of the electronic properties of the specimen combines two series of measurements performed using excitation pulses of different wavelength and intensity. Wavelength (such as 830 nm laser diode) of the excitation pulses in one series of measurements is selected to generate electron-hole pairs through an entire depth of the specimen, generating carriers both in the vicinity of the surface as well as in the bulk. In this case carrier recombination occurs at the surface as well as at the extended and at the point imperfections in the bulk. The decay of the photoconductance following these pulses is illustrated in FIG. 18 with the line labeled $\Delta\sigma_{TOTAL}$ ($\Delta\sigma_{TOTAL}=\Delta\sigma_{BULK}+\Delta\sigma_{SURFACE}$) calculated using following parameters for the bulk photoconductance decay simulation: $N_D=10^{15}$ cm$^{-3}$, $Q_{do}=-2\times10^{10}$ q/cm$^2$, $N_t=10^{11}$ cm$^{-2}$, $G_b=10^{16}$ cm$^{-2}$s$^{-1}$, and $\tau_b=3$ μs; and for the surface: $Q_{do}=-4\times10^{10}$ q/cm$^2$ and $N_t=2\times10^{11}$ cm$^{-2}$. The other series of pulses uses shorter wavelength (such as 660 nm or 415 nm) to generate photoconductance decay associated predominantly with the surface recombination. The results of such measurements are illustrated in FIG. 18 with the line labeled $\Delta\sigma_{SURFACE}$. For $t>\tau_0$ photoconductance decay associated with the extended bulk defects and with the surface is logarithmic and subtracting $\Delta\sigma_{SURFACE}$ data from $\Delta\sigma_{TOTAL}$ produces decay illustrated in FIG. 18 with dotted line labeled $\Delta\sigma_{BULK}$ ($\Delta\sigma_{BULK}=\Delta\sigma_{TOTAL}-\Delta\sigma_{SURFACE}$). The procedure for analysis of $\Delta\sigma_{BULK}$ and determining contributions of the extended and point imperfection in the bulk is closely related to the procedure disclosed in the previous section "Separation of the Bulk and Surface Properties". The data $\Delta\sigma_{SURFACE}$ are used to characterize recombination properties of the surface.

In another embodiment, different types of imperfections are distinguished by analyzing the dependence of the steady-state photoconductance on the intensity of the illumination light.

Other embodiments not explicitly described herein are also within the scope of the claims. For instance, if generation rates for a certain type of sample are not low enough to reveal the logarithmic component of the photoconductance decay or not high enough to suppress an initial deviation from logarithmic decay (that is, if $\tau_0$ is too high), measurement could be performed at two or more generation rates and time constants could be determined by numerical iteration. Additionally, electronic properties of a sample could be obtained by analyzing the time dependent rise in photoconductance when an illumination pulse first strikes the sample. The wavelength dependence of photoconductance also provides data for distinguishing between different types of imperfections in a sample. The methods described herein are of particular interest in solar cell manufacturing and, more generally, in any semiconductor manufacturing process utilizing thin films, such as large panel displays. Furthermore, these methods can be used for real-time in-line testing of semiconductor materials.

It is to be understood that the foregoing description is intended to illustrate and not to limit the scope of the invention, which is defined by the scope of the appended claims. Other embodiments are within the scope of the following claims.

What is claimed is:

1. A method for characterizing electronic properties with specific dimensional classes of defects in a semiconductor sample, the method comprising:

illuminating the surface of the semiconductor sample with a first pulse of light having a predetermined duration and a photon energy higher than an energy gap of the semiconductor;

measuring a photoconductance decay in the semiconductor sample after the cessation of the first pulse of light;

identifying in the photoconductance decay a first component that is substantially exponential and a second component that is substantially logarithmic; and analyzing the time dependence of the first and second components of the photoconductance decay to identify electronic properties associated with specific dimensional classes of defects, wherein the first component of the photoconductance decay is substantially associated with electronic properties of point imperfections in the semiconductor sample and the second component of the photoconductance decay is substantially associated with electronic properties of extended imperfections in the semiconductor sample.

2. The method of claim 1 wherein illuminating the surface of the semiconductor sample and measuring the photoconductance decay is performed using a probe that is spaced a constant distance from the semiconductor sample.

3. The method of claim 2 wherein the electronic properties of the bulk of the semiconductor sample are determined by analyzing the first component of the photoconductance decay and the electronic properties of the surface of the semiconductor sample are determined by analyzing the second component of the photoconductance decay.

4. The method of claim 3 wherein the bulk of the semiconductor sample includes only point imperfections and the surface of the semiconductor sample includes only extended imperfections.

5. The method of claim 2 wherein the bulk of the semiconductor sample includes at least one of point imperfections and extended imperfections and the surface of the semiconductor sample is passivated.

6. The method of claim 5 wherein the electronic properties of the point imperfections in the bulk of the semiconductor sample are determined by analyzing the first component of the photoconductance decay and the electronic properties of the extended imperfections in the bulk of the semiconductor sample are determined by analyzing the second component of the photoconductance decay.

7. The method of claim 1 wherein the pulse of light has a duration sufficient to achieve steady-state photoconductance in the sample.

8. The method of claim 1 further comprising the step of illuminating the surface of the semiconductor sample with a second pulse of light having a predetermine duration and a photon energy higher than the energy gap of the semiconductor, wherein an interval between the first and second pulses of light is sufficient to allow the sample to substantially reach thermal equilibrium.

9. A method for characterizing electronic properties of a semiconductor sample, the bulk of the semiconductor sample including at least one of point imperfections and extended imperfections, the surface of the semiconductor sample being passivated, the electronic properties including properties associated with at least one of the bulk of the semiconductor sample and the surface of the semiconductor sample, the method comprising:
   illuminating the surface of the semiconductor sample with a pulse of light having a predetermined duration and a photon energy higher than an energy gap of the semiconductor;
   measuring a photoconductance decay in the semiconductor sample after the cessation of the first pulse of light, wherein the illumination and measuring steps are performed at a constant distance from the semiconductor sample;
   analyzing the photoconductance decay to determine a first component of the photoconductance decay substantially associated with point imperfections in the semiconductor sample and at least one second component of the photoconductance decay substantially associated with extended imperfections in the semiconductor sample; and
   determining a ratio of a first volume of the semiconductor sample in which point imperfections dominate carrier recombination to a second volume of the semiconductor sample in which extended imperfections dominate carrier recombination.

10. A method for characterizing electronic properties of a semiconductor sample, the bulk of the semiconductor sample comprises electronic properties associated with point imperfections and electronic properties associated with extended imperfections, the surface of the semiconductor sample being substantially not passivated, the electronic properties including properties associated with at least one of the bulk of the semiconductor sample and the surface of the semiconductor sample, the method comprising:
   illuminating the surface of the semiconductor sample with a first pulse of light having a first wavelength, a predetermined duration and a first intensity higher than an energy gap of the semiconductor;
   measuring a first photoconductance decay in the semiconductor sample after the cessation of the first pulse of light, wherein the illumination and measuring steps are performed at a constant distance from the semiconductor sample;
   analyzing the first photoconductance decay to determine a first component of the photoconductance decay substantially associated with point imperfections in the semiconductor sample and a second component of the photoconductance decay substantially associated with extended imperfections in the bulk and surface of the semiconductor sample;
   illuminating the surface of the semiconductor sample with a second pulse of light having a second wavelength, a predetermined duration and a second intensity higher than an energy gap of the semiconductor, at least one of the second wavelength and the second intensity being different from the first wavelength and first intensity of the first pulse of light;
   measuring a second photoconductance decay in the semiconductor sample after the cessation of the second pulse of light, wherein the illumination and measuring steps are performed at a constant distance from the semiconductor sample;
   analyzing the second photoconductance decay to determine a third component of the photoconductance decay substantially associated with extended imperfections in the bulk and surface of the semiconductor sample;
   distinguishing between the electronic properties associated with extended imperfections in the bulk and electronic properties of the surface of the semiconductor sample on the basis of the second component of the photoconductance decay and the third component of the photoconductance decay; and
   determining a ratio of a first volume of the semiconductor sample in which point imperfections dominate carrier recombination to a second volume of the bulk of the semiconductor sample in which extended imperfections dominate carrier recombination.

11. A method for characterizing electronic properties with specific dimensional classes of defects in a semiconductor sample, the method comprising:
   illuminating the surface of the semiconductor sample with a first pulse of light having a predetermined duration and a photon energy higher than an energy gap of the semiconductor;
   measuring a photoconductance decay in the semiconductor sample after the cessation of the first pulse of light;
   identifying in the photoconductance decay a first component that is substantially exponential and a second component that is substantially non-exponential; and
   analyzing the time dependence of the first and second components of the photoconductance decay to identify electronic properties associated with specific dimensional classes of defects, wherein the first component of the photoconductance decay is substantially associated with electronic properties of point imperfections in the semiconductor sample and the second component of the photoconductance decay is substantially associated with electronic properties of extended imperfections in the semiconductor sample.

12. A method for characterizing electronic properties with specific dimensional classes of defects in a semiconductor sample, the method comprising:

illuminating the surface of the semiconductor sample with a first pulse of light having a predetermined duration and a photon energy higher than an energy gap of the semiconductor;

measuring a first photoconductance decay in the semiconductor sample after the cessation of the first pulse of light;

illuminating the surface of the semiconductor sample with a second pulse of light having a predetermined duration and photon energy higher than an energy gap of the semiconductor, the second pulse of light varying from the first pulse of light in at least one of wavelength and intensity;

measuring a second photoconductance decay in the semiconductor sample after the cessation of the second pulse of light;

combining the first measured photoconductance decay with the second measured photoconductance decay to yield a combined photoconductance decay;

identifying in the combined photoconductance decay a first component that is substantially exponential and a second component that is substantially logarithmic; and analyzing the time dependence of the first and second components of the combined photoconductance decay to identify electronic properties associated with specific dimensional classes of defects, wherein the first component of the combined photoconductance decay is substantially associated with electronic properties of point imperfections in the semiconductor sample and the second component of the combined photoconductance decay is substantially associated with electronic properties of extended imperfections in the semiconductor sample.

* * * * *